United States Patent
Hayashi

(10) Patent No.: US 9,485,877 B2
(45) Date of Patent: Nov. 1, 2016

(54) STRUCTURE FOR CIRCUIT BOARD USED IN ELECTRONIC DEVICES AND METHOD FOR MANUFACTURING THE SAME

(75) Inventor: Katsura Hayashi, Yasu (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 686 days.

(21) Appl. No.: 13/498,764

(22) PCT Filed: Sep. 28, 2010

(86) PCT No.: PCT/JP2010/066865
§ 371 (c)(1),
(2), (4) Date: Apr. 11, 2012

(87) PCT Pub. No.: WO2011/037265
PCT Pub. Date: Mar. 31, 2011

(65) Prior Publication Data
US 2012/0189826 A1    Jul. 26, 2012

(30) Foreign Application Priority Data

| Sep. 28, 2009 | (JP) | 2009-222549 |
| Oct. 29, 2009 | (JP) | 2009-249352 |
| Dec. 26, 2009 | (JP) | 2009-296517 |
| Dec. 26, 2009 | (JP) | 2009-296518 |

(51) Int. Cl.
*B32B 3/00* (2006.01)
*B32B 9/04* (2006.01)
(Continued)

(52) U.S. Cl.
CPC ....... *H05K 3/4673* (2013.01); *H01L 23/49894* (2013.01); *H05K 3/4602* (2013.01); *H05K 3/4655* (2013.01); *H01L 23/49822* (2013.01);
(Continued)

(58) Field of Classification Search
CPC ................................ H05K 2201/0209
See application file for complete search history.

(56) References Cited

U.S. PATENT DOCUMENTS

| 5,686,172 A | 11/1997 | Ohya et al. |
| 6,113,730 A | 9/2000 | Ohya et al. |

(Continued)

FOREIGN PATENT DOCUMENTS

| JP | 2253941 | 10/1990 |
| JP | H03114284 A | 5/1991 |

(Continued)

OTHER PUBLICATIONS

Chinese Office Action, Chinese Patent Application No. 201080043564.3, Feb. 8, 2014, 5 pp.
(Continued)

Primary Examiner — Ian Rummel
(74) Attorney, Agent, or Firm — Volpe and Koenig, P.C.

(57) ABSTRACT

A structure for which the electrical reliability is improved is provided. A structure in accordance with one embodiment includes an inorganic insulating layer including amorphous silicon oxide and having an elastic modulus which is 45 GPa or less. A method for manufacturing a structure in accordance with one embodiment includes applying an inorganic insulating sol including inorganic insulating particles composed of amorphous silicon oxide, and forming an inorganic insulating layer including amorphous silicon oxide and having an elastic modulus which is 45 GPa or less by heating the inorganic insulating particles at a temperature lower than a crystallization onset temperature of silicon oxide to each other.

12 Claims, 15 Drawing Sheets

(51) Int. Cl.
  *B32B 18/00* (2006.01)
  *B32B 7/02* (2006.01)
  *H05K 3/46* (2006.01)
  *H01L 23/498* (2006.01)

(52) U.S. Cl.
  CPC ............... *H01L 23/49827* (2013.01); *H01L 2224/16225* (2013.01); *H05K 2201/0175* (2013.01); *H05K 2201/0195* (2013.01); *H05K 2201/0209* (2013.01); *H05K 2201/0355* (2013.01); *H05K 2203/1152* (2013.01); *Y10T 428/24802* (2015.01); *Y10T 428/24942* (2015.01)

(56) References Cited

U.S. PATENT DOCUMENTS

| | | | |
|---|---|---|---|
| 6,495,264 | B2 | 12/2002 | Hayashi et al. |
| 2002/0020327 | A1 | 2/2002 | Hayashi et al. |
| 2006/0084277 | A1 | 4/2006 | Nakashima et al. |
| 2007/0111539 | A1 | 5/2007 | Kon et al. |
| 2007/0164349 | A1* | 7/2007 | Nakasato et al. .......... 257/318 |
| 2007/0178279 | A1 | 8/2007 | Ogawa et al. |
| 2007/0241450 | A1 | 10/2007 | Hiramatsu et al. |
| 2008/0011987 | A1 | 1/2008 | Arao et al. |
| 2008/0182115 | A1 | 7/2008 | Briney et al. |
| 2009/0025609 | A1 | 1/2009 | Egami et al. |
| 2009/0110909 | A1 | 4/2009 | Innocenzo et al. |

FOREIGN PATENT DOCUMENTS

| | | | |
|---|---|---|---|
| JP | 05147152 | A | 6/1993 |
| JP | 05254052 | A | 10/1993 |
| JP | H0640783 | A | 2/1994 |
| JP | H8172251 | A | 7/1996 |
| JP | 11-092627 | A | 4/1999 |
| JP | 2001354904 | | 12/2001 |
| JP | 2003124635 | A | 4/2003 |
| JP | 2003-258436 | A | 9/2003 |
| JP | 2003283141 | A | 10/2003 |
| JP | 2004153147 | A | 5/2004 |
| JP | 2004281999 | A | 10/2004 |
| JP | 2005327757 | A | 11/2005 |
| JP | 2006117763 | A | 5/2006 |
| JP | 2006285226 | | 10/2006 |
| JP | 2007141875 | | 6/2007 |
| JP | 2007266416 | A | 10/2007 |
| JP | 2007281115 | A | 10/2007 |
| JP | 2007311770 | A | 11/2007 |
| JP | 2009004709 | | 1/2009 |
| JP | 2009004709 | A | 1/2009 |
| WO | 2006043474 | A1 | 4/2006 |
| WO | 2007072750 | | 6/2007 |
| WO | 2007072750 | A1 | 6/2007 |

OTHER PUBLICATIONS

Japanese Office Action, Japanese Patent Application No. 2012-7008356, Apr. 29, 2013, 5 pp.
Japanese Office Action with English concise explanation, Japanese Patent Appln. No. 2011-533080, Jun. 3, 2014, 3 pp.
Japanese Office Action with English concise explanation, Japanese Patent Appln. No. 2010-216683, Mar. 18, 2014, 3 pp.
Japanese Office Action, Japanese Patent Application No. 2011-533084, Mar. 19, 2013, 3 pp.
Japanese Office Action with English concise explanation, Japanese Patent Appln. No. 2011-533084, Jun. 3, 2014, 3 pp.
Korean Office Action, Korean Patent Application No. 2012-7008356, Apr. 29, 2013, 5 pp.
Japanese Office Action, Japanese Patent Application No. 2013-105611, Feb. 12, 2014, 2 pp.
United States Office Action, U.S. Appl. No. 13/498,802, Jul. 16, 2015, 17 pgs.
Ciullo, P.A., (1996), Industrial Minerals and Their Uses—A Handbook and Formulary—7.8.9 Fumed Silica. William Andrew Publishing/Noyes. Online version available at: app.knovel.com/hotlink/pdf/id:kt005CCQ21/industrial-minerals-their/fillers-fumed-silica.

* cited by examiner (a)

(b)

(a)

(b)

(c)

(d)

(e)

(f)

(a)

(b)

(c)

(a)

(b)

(a)

(b)

(a)

(b)

(a)

(b)

(a)

(b)

(a)

(b)

(a)

(b)

US 9,485,877 B2

STRUCTURE FOR CIRCUIT BOARD USED IN ELECTRONIC DEVICES AND METHOD FOR MANUFACTURING THE SAME

TECHNICAL FIELD

The present invention relates to a structure for use in a variety of objects such as electronic devices (for example, a variety of audio-visual devices, home appliances, communication devices, computer devices, and peripheral devices thereof), transport air planes, and buildings, and a method for manufacturing the same.

BACKGROUND

There has been known a circuit board having a resin layer and a ceramic layer as a circuit board used for electronic devices.

For example, Japanese Unexamined Patent Publication JP-A 2-253941 (1990) describes a circuit board formed by thermally spraying ceramic on one surface of a metallic foil so as to form a ceramic layer, laminating a prepreg so as to be into contact with the metallic foil on the ceramic layer side, and thermocompressionally molding the laminated body.

However, in general, a ceramic layer and a resin layer are connected together with less adhesion strength. Therefore, when the circuit board is subjected to a stress, the ceramic layer and the resin layer are liable to separate from each other. The accidental separation could lead to a break in wiring, in consequence whereof there results deterioration in the electrical reliability of the circuit board.

As a result, there is a demand for provision of a circuit board for which the electrical reliability is improved.

SUMMARY OF INVENTION

Technical Problem

The invention achieves the above demand by providing a structure for which the electrical reliability is improved.

Solution to Problem

A structure in accordance with one embodiment of the invention includes an inorganic insulating layer including amorphous silicon oxide and having an elastic modulus which is 45 GPa or less.

A method for manufacturing a structure in accordance with one embodiment of the invention includes applying an inorganic insulating sol comprising inorganic insulating particles composed of amorphous silicon oxide, and forming an inorganic insulating layer including amorphous silicon oxide and having an elastic modulus which is 45 GPa or less by heating the inorganic insulating particles at a temperature lower than a crystallization onset temperature of silicon oxide and connecting the inorganic insulating particles to each other.

Advantageous Effects of Invention

According to the construction thus far described, it is possible to provide a structure for which the electrical reliability is improved.

DESCRIPTION OF EMBODIMENTS

Hereinafter, a circuit board according to a first embodiment of the invention will be described in detail based on the accompanying drawings.

Figure 1:
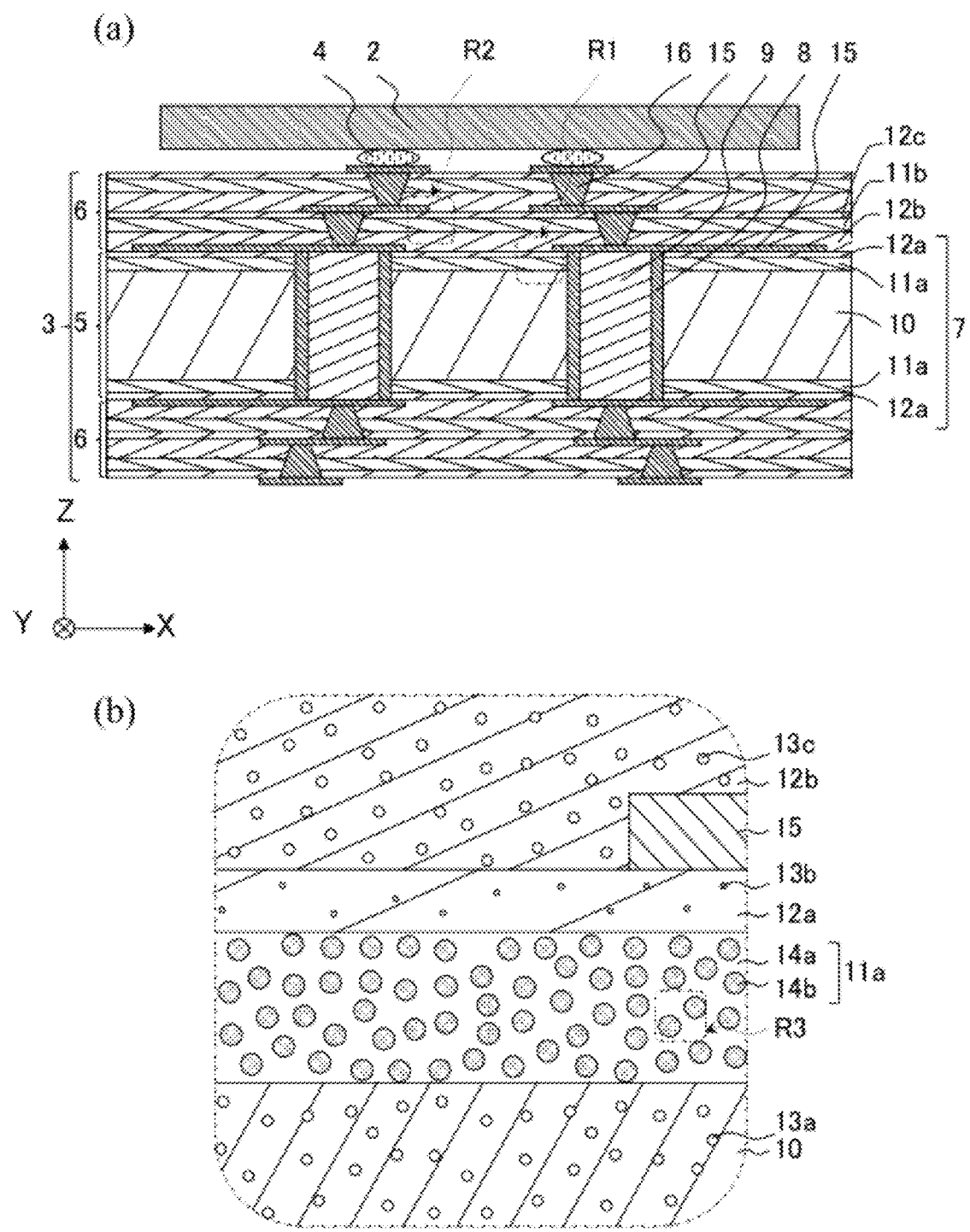
FIG. 1A is a cross-sectional view of a mounting structure having a circuit board in accordance with the first embodiment of the invention, which is cut in a thickness direction thereof.
FIG. 1B is an enlarged cross-sectional view showing an R1 section of the mounting structure as shown in FIG. 1A.

A circuit board 3 as shown in FIG. 1A is used for electronic devices, for example, a variety of audio-visual devices, home appliances, communication devices, computer devices, and peripheral devices thereof.

The circuit board 3 includes a core substrate 5 and a pair of circuit layers 6 disposed on top and bottom surfaces of the core substrate 5, and has functions of supporting an electronic component 2 and supplying power or signals for driving or controlling the electronic component 2 to the electronic component 2.

Meanwhile, the electronic component 2 is, for example, a semiconductor element, such as an IC or LSI, and is flip-chip-mounted on the circuit board 3 via a bump 4 composed of a conductive material, such as solder. The electronic component 2 has a base material that is formed of a semiconductor material, such as silicon, germanium, gallium arsenide, gallium arsenide phosphide, gallium nitride, or silicon carbide.

Hereinafter, the configuration of the circuit board 3 will be described in detail.

(Core Substrate)

The core substrate 5 enhances the stiffness of the circuit board 3, achieves conduction between the pair of circuit layers 6, and includes a base 7 that supports the circuit layers 6, through holes provided in the base 7, cylindrical through hole conductors 8 that are provided in the through holes and electrically connect the pair of circuit layers 6, and insulating bodies 9 that are surrounded with the through hole conductors 8.

The base 7 includes a resin base 10, first inorganic insulating layers 11a disposed on top and bottom surfaces, respectively, of the resin base 10, and first resin layers 12a, each of which is disposed on one main surface of the first inorganic insulating layer 11a so as to serve as an outermost layer of the base 7.

The resin base 10 constitutes a main part of the base 7, and includes, for example, a resin portion and a base member coated with the resin portion. The resin base 10 is set to, for example, 0.1 mm or more and 3.0 mm or less in thickness, for example, 3 ppm/° C. or more and 20 ppm/° C. or less in coefficient of thermal expansion in a planar direction thereof, for example, 30 ppm/° C. or more and 50 ppm/° C. or less in coefficient of thermal expansion in a thickness direction thereof, and, for example, 0.01 or more and 0.02 or less in dielectric loss tangent.

The coefficient of thermal expansion of the resin base 10 is measured by a measurement method according to JIS K 7197-1991 using a commercially available thermo-mechanical analysis (TMA) apparatus. Moreover, the dielectric loss tangent of the resin base 10 is measured by a dielectric resonator method according to JIS R 1627-1996. In what follows, the coefficient of thermal expansion and dielectric loss tangent of each of the constituent components, including the first and second resin layers 12a and 12b and the first and second inorganic insulating layers 11a and 11b, are measured by a measurement method similar to that adopted for the resin base 10.

The resin portion of the resin base 10 can be formed of, for example, a thermosetting resin, such as an epoxy resin, a bismaleimide triazine resin, a cyanate resin, a polyphenylene ether resin, a wholly aromatic polyamide resin, or a polyimide resin. The resin portion is set to, for example, 0.1 GPa or more and 5 GPa or less in elastic modulus, for example, 0.02 GPa or more and 0.5 GPa or less in hardness, and, for example, 20 ppm/° C. or more and 50 ppm/° C. or less in coefficients of thermal expansion in the thickness direction and the planar direction thereof.

The elastic modulus and hardness of the resin portion of the resin base 10 are measured by the measurement method according to ISO 14577-1:2002 as follows: Firstly, the resin portion of the resin base 10 is cut along the thickness direction thereof, and the surface of cross section is polished by using argon ion. Subsequently, using a nano-indenter, a load is applied to the diamond-made Berkovich indenter of the nano-indenter so that the indenter is pressed against the polished surface. Next, the load applied to the indenter in a pressed state is divided by the projected contact area of the indenter to calculate the hardness. Moreover, a load-displacement curve is derived on the basis of the relationship between the pressing load and the pressing depth, and the elastic modulus is calculated from the load-displacement curve. For example, NANO INDENTER XP manufactured by MTS Systems Corporation can be used for the measurement. In what follows, the elastic modulus and hardness of each of the constituent components, including the first and second resin layers 12a and 12b and the first and second inorganic insulating layers 11a and 11b, are measured by a measurement method similar to that adopted for the resin base 10.

The base member included in the resin base 10 reduces the coefficient of thermal expansion in the planar direction of the resin base 10, and enhances the stiffness of the resin base 10. The base member can be formed of a fiber group in which, for example, woven fabrics or non-woven fabrics composed of a plurality of fibers or a plurality of fibers are arrayed in a single direction. Examples of the fibers that can be used include a glass fiber, a resin fiber, a carbon fiber, a metal fiber, and the like.

In the present embodiment, the resin base 10 further includes a first filler 13a composed of a number of first filler particles that are formed of an inorganic insulating material. As a result, it is possible to reduce the coefficient of thermal expansion of the resin base 10, and enhance the stiffness of the resin base 10. The first filler particles can be formed of an inorganic insulating material, for example, silicon oxide, aluminum oxide, aluminum nitride, aluminum hydroxide, calcium carbonate, or the like. The first filler particle is set to, for example, 0.5 µm or more and 5.0 µm or less in particle diameter, and, for example, 0 ppm/° C. or more and 15 ppm/° C. or less in coefficient of thermal expansion. In addition, the ratio of the volume of the first filler 13a to the total volume of the resin portion of the resin base 10 and the first filler 13a (hereinafter referred to as the "content of the first filler 13a") is set to, for example, 3% by volume or more and 60% by volume or less.

Here, the particle diameter of the first filler particles is measured as follows: Firstly, a polished surface or ruptured surface of the resin base 10 is observed using a field emission scanning electron microscope, and a cross section that is enlarged so as to include 20 particles to 50 particles is photographed. Next, the largest size of each particle is measured on the enlarged cross section, and the measured largest particle diameter is considered as the particle diameter of the first filler particles. In addition, the content (% by volume) of the first filler 13a is measured by photographing a polished surface of the resin base 10 using a field emission scanning electron microscope, measuring the area proportion (% by area) of the filler 13a in the resin portion of the resin base 10 in cross sections at 10 places using an image analysis apparatus or the like, computing an average value of the measured values, and using the average value as the content (% by volume).

Meanwhile, the first inorganic insulating layer 11a disposed on each of the top and bottom surfaces of the resin base 10 is made of an inorganic insulating material including silicon oxide having a low dielectric loss tangent and a low coefficient of thermal expansion. Since the inorganic insulating material exhibits higher rigidity than does a resin material, it follows that the first inorganic insulating layer 11a has a function of enhancing the rigidity of the base 7.

Since the coefficient of thermal expansion of the first inorganic insulating layer 11a in the planar direction thereof is lower than the coefficient of thermal expansion of an ordinary resin material in the planar direction, it is possible to approximate the coefficient of thermal expansion of the circuit board 3 in the planar direction thereof to the coefficient of thermal expansion of the electronic component 2 in the planar direction thereof, and warpage of the circuit board 3 due to a thermal stress can be reduced.

Since the coefficient of thermal expansion of the first inorganic insulating layer 11a in the thickness direction thereof is lower than the coefficient of thermal expansion in the thickness direction of a resin film having a low coefficient of thermal expansion in the planar direction thereof, compared to a case in which the resin film is used, it is possible to reduce the coefficient of thermal expansion of the base 7 in the thickness direction, to decrease a thermal stress caused by the difference in the coefficient of thermal expansion between the base 7 and the through hole conductor 8, and to reduce breaking of the through hole conductor 8.

Since, generally, the inorganic insulating material has a lower dielectric loss tangent than the resin material, and the first inorganic insulating layers 11a are disposed closer to the circuit layer 6 than the resin base 10, it is possible to enhance the signal transmission characteristics of the circuit layers 6 disposed on the top and bottom surfaces of the core substrate 5.

The thickness of the first inorganic insulating layer 11a is set to, for example, 3 μm or more and 100 μm or less, and/or 3% or more and 10% or less of the thickness of the resin base 10. In addition, the elastic modulus of the first inorganic insulating layer 11a is set to, for example, 10 GPa or more and 45 GPa or less, and/or 5 times or more and 100 times or less the elastic modulus of the resin portion of the resin base 10. The hardness of the first inorganic insulating layer 11a is set to, for example, 0.5 GPa or more and 4 GPa or less, and/or 2 times or more and 100 times or less the hardness of the resin portion of the resin base 10. The first inorganic insulating layer 11a is set to, for example, 0 ppm/° C. or more and 10 ppm/° C. or less in coefficient of thermal expansion in the thickness direction and the planar direction thereof, and, for example, 0.0001 or more and 0.001 or less in dielectric loss tangent.

As the inorganic insulating material constituting the first inorganic insulating layer 11a, for example, an inorganic insulating material having a silicon oxide content of 90% by weight or more can be used. In particular, it is desirable to use an inorganic insulating material having a silicon oxide content of 99% by weight or more and less than 100% by weight. In the case of using an inorganic insulating material having a silicon oxide content of 90% by weight or more and less than 100% by weight, the inorganic insulating material may be made to include, in addition to silicon oxide, other inorganic insulating substance such for example as aluminum oxide, titanium oxide, magnesium oxide, or zirconium oxide.

Moreover, silicon oxide included in the first inorganic insulating layer 11a is in an amorphous state. Amorphous silicon oxide is, in contrast to an inorganic insulating substance in a crystalline state, capable of the lessening of thermal expansion anisotropy ascribable to the presence of a crystalline structure. Therefore, when the circuit board 3 in a heated state is cooled down, it is possible to make the degree of shrinkage of the first inorganic insulating layer 11a uniform throughout its entirety in the thickness direction and the planar direction thereof, and it is possible to reduce occurrence of cracking in the first inorganic insulating layer 11a. Meanwhile, in amorphous silicon oxide, it is desirable that the area of crystal phase is set to less than 10% by volume, in particular, less than 5% by volume.

Here, the volume proportion of the crystalline phase region in silicon oxide is measured as follows: Firstly, a plurality of comparative samples including different ratios of 100%-crystallized sample powder and amorphous powder are manufactured, and the comparative samples are measured by an X-ray diffraction method, thereby producing a calibration curve showing the relative relationship between the measured values and the volume proportion of the crystalline phase region. Next, an investigation sample, which is a measurement subject, is measured by the X-ray diffraction method, the measured value and the calibration curve are compared, and the volume proportion of the crystalline phase region is computed from the measured value, thereby measuring the volume proportion of the crystalline phase region in the investigation sample.

As shown in FIG. 1B, the first inorganic insulating layer 11a as described above includes a plurality of first inorganic insulating particles 14a and a plurality of second inorganic insulating particles 14b that have a larger particle diameter than that of the first inorganic insulating particles 14a. The plurality of first inorganic insulating particles 14a and the plurality of second inorganic insulating particles 14b can be formed of, for example, the inorganic insulating material as described above, such as silicon oxide, aluminum oxide, boron oxide, magnesium oxide, calcium oxide, or the like. In addition, the first and second inorganic insulating layers 11a and 11b include 20% by volume or more and 90% by volume or less of the first inorganic insulating particles 14a with respect to the total volume of the first inorganic insulating particles 14a and the second inorganic insulating particles 14b, and 10% by volume or more and 80% by volume or less of the second inorganic insulating particles 14b with respect to the above total volume.

Figure 2:
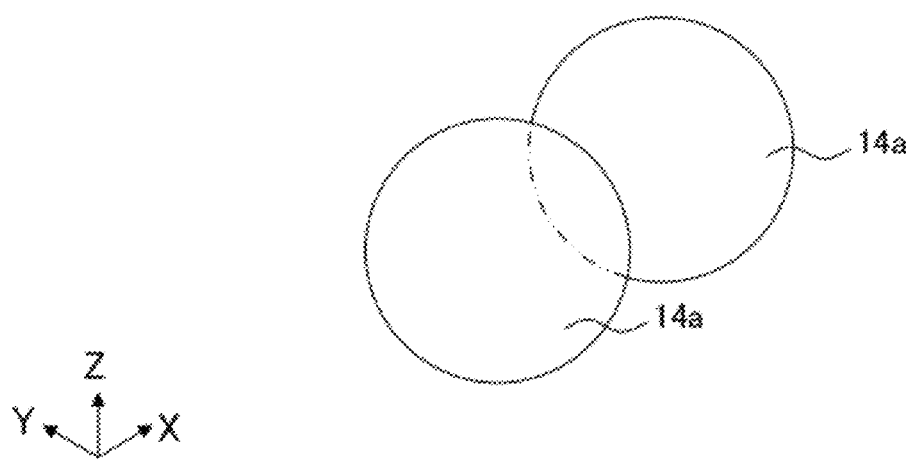
FIG. 2A is a view schematically showing a connecting state of two first inorganic insulating particles.
FIG. 2B is an enlarged cross-sectional view showing an R2 section of the mounting structure as shown in FIG. 1A.
Figure 2:
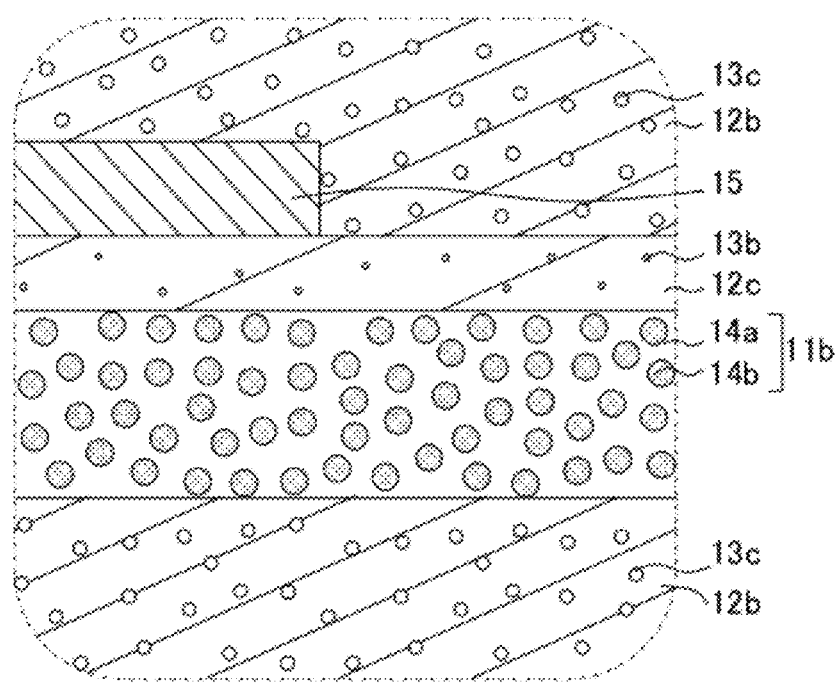

The particle diameter of the first inorganic insulating particles 14a is set to 3 nm or more and 110 nm or less, and, as shown in FIG. 2A, the first inorganic insulating particles are connected to each other so as to densely form the inside of the first inorganic insulating layer 11a.

Meanwhile, the elastic modulus of the first inorganic insulating particles 14a is set to, for example, 10 GPa or more and 30 GPa or less, and the hardness of the first inorganic insulating particles are set to, for example, 0.5 GPa or more and 2 GPa or less.

Moreover, the second inorganic insulating particles 14b are set to, for example, 0.5 μm or more and 5 μm or less in particle diameter, and the second inorganic insulating particles 14b are connected with the first inorganic insulating particles 14a so as to be adhered to each other via the first inorganic insulating particles 14a. Meanwhile, the elastic modulus of the second inorganic insulating particles 14b is set to, for example, 40 GPa or more and 75 GPa or less, and/or, for example, 2 times or more and 7 times or less the elastic modulus of the first inorganic insulating particles 14a. In addition, the hardness of the second inorganic insulating particles is set to, for example, 5 GPa or more and 10 GPa or less, and/or, for example, 3 times or more and 20 times or less the hardness of the first inorganic insulating particles 14a.

Here, the first inorganic insulating particles 14a and the second inorganic insulating particles 14b are confirmed by observing a polished surface or ruptured surface of the first inorganic insulating layer 11a using a field emission scanning electron microscope. In addition, the percentage by volume of the first inorganic insulating particles 14a and the second inorganic insulating particles 14b are computed as follows: Firstly, a polished surface of the first inorganic insulating layer 11a is photographed using a field emission scanning electron microscope. Next, the area proportions (% by area) of the first inorganic insulating particles 14a and the second inorganic insulating particles 14b are measured from the photographed image using an image analysis apparatus or the like. Additionally, an average value of the measured values is computed so as to compute the percentage by volume of the first and second inorganic insulating particles 14a and 14b. In addition, the particle diameters of the first inorganic insulating particles 14a and the second inorganic insulating particles 14b are measured by observing a polished surface or ruptured surface of the inorganic insulating layer 11 using a field emission scanning electron microscope, photographing a cross section that is enlarged so as to include 20 particles or more and 50 particles or less, and measuring the largest size of each particle on the photographed enlarged cross section.

Meanwhile, the first resin layer 12a disposed on one main surface of the inorganic insulating layer 11a lies between the inorganic insulating layer 11a and a conductive layer 15 which will be described below. The first resin layer 12a has a function of relaxing the thermal stress exerted between the first inorganic insulating layer 11a and the conductive layer 15, and a function of reducing breaking in the conductive layer 15 resulting from a crack of the first inorganic insulating layer 11a. The first resin layer 12a is so configured that one main surface thereof is in contact with the first inorganic insulating layer 11a, and the other main surface thereof is in contact with the conductive layer 15. For example, the first resin layer 12a includes a resin portion and a second filler 13b coated with the resin portion.

Moreover, the first resin layer 12a is set to, for example, 0.1 µm or more and 5 µm or less in thickness, for example, 0.01 GPa or more and 1 GPa or less in elastic modulus, for example, 0.01 GPa or more and 0.3 GPa or less in hardness, 20 ppm/° C. or more and 100 ppm/° C. or less in coefficient of thermal expansion in the thickness direction and the planar direction thereof, and, for example, 0.005 or more and 0.02 or less in dielectric loss tangent.

The resin portion included in the first resin layer 12a constitutes a main part of the first resin layer 12a, and is made of a thermosetting resin such for example as an epoxy resin, a bismaleimide triazine resin, a cyanate resin, or a polyimide resin.

The second filler 13b included in the first resin layer 12a has a function of enhancing the flame resistance of the first resin layer 12a, and a function of suppressing adhesion between laminate sheets during handling which will be described below. The second filler 13b is composed of a large number of second filler particles made of an inorganic insulating material such for example as silicon oxide. The second filler particles are set to, for example, 0.05 µm or more and 0.7 µm or less in particle diameter, and the content of the second filler particles in the first resin layer 12a is set to, for example, 0% by volume or more and 10% by volume or less. Meanwhile, the particle diameter and the content of the second filler particles are measured by a measurement method similar to that adopted for the first filler particles.

In addition, the base 7 is provided with through holes that penetrate the base 7 in the thickness direction, and have, for example, a columnar shape having a diameter of 0.1 mm or more and 1 mm or less. Inside the through hole, the through hole conductor 8 that electrically connects the circuit layers 6 on the top and bottom of the core substrate 5 is disposed along the inner wall of the through hole in a tubular shape. The through hole conductor 8 can be formed of a conductive material, for example, copper, silver, gold, aluminum, nickel, chromium, or the like, and the coefficient of thermal expansion is set to, for example, 14 ppm/° C. or more and 18 ppm/° C. or less.

In the hollow portion of the through hole conductor 8 shaped in a tubular shape, an insulating body 9 is shaped in a columnar shape. The insulating body 9 can be formed of a resin material, for example, a polyimide resin, an acryl resin, an epoxy resin, a cyanate resin, a fluororesin, a silicone resin, a polyphenylene ether resin, a bismaleimide triazine resin, or the like.

(Circuit Layer)

Meanwhile, the pair of circuit layers 6 are disposed on the top and bottom surfaces of the core substrate 5 as described above.

Of the pair of circuit layers 6, one circuit layer 6 is connected to the electronic component 2 via a solder 3, and the other circuit layer 6 is connected to an external circuit board (not shown) via a joining material (not shown).

Each of the circuit layers 6 includes a plurality of conductive layers 15 disposed on a part of the first resin layer 12a or on a third resin layer 12c which will be described below; a plurality of second resin layers 12b disposed on the conductive layer 15-free regions of the first resin layer 12a or the third resin layer 12c; a plurality of second inorganic insulating layers 11b disposed on the second resin layers 12b; a plurality of third resin layers 12c disposed on the second inorganic insulating layers 11b; a plurality of via holes that penetrate the second resin layer 12b, the second inorganic insulating layer 11b, and the third resin layer 12c; and a plurality of via conductors 16 disposed within their respective via holes. Moreover, the conductive layer 15 and the via conductor 16 are electrically connected to each other, for constituting grounding wiring line, power supply wiring line, and/or signal wiring line.

The plurality of conductive layers 15 are so arranged as to be spaced apart in the thickness direction, with the second resin layer 12b, the second inorganic insulating layer 11b, and the third resin layer 12c lying in between, as well as to be spaced apart in the planar direction, with the second resin layer 12b lying in between. The conductive layer 15 can be made of a conductive material, for example, copper, silver, gold, aluminum, nickel, or chromium. Moreover, the conductive layer 15 is set to, for example, 3 µm or more and 20 µm or less in thickness, and, for example, 14 ppm/° C. or more and 18 ppm/° C. or less in coefficient of thermal expansion.

The second resin layer 12b makes contact with the side surfaces and the other main surface of the conductive layer 15, and serves as an insulating member for preventing electrical short-circuiting between the conductive layers 15 that are spaced apart in the thickness direction or the planar direction. The second resin layer 12b can be made of a thermosetting resin such for example as an epoxy resin, a bismaleimide triazine resin, a cyanate resin, a polyphenylene ether resin, a wholly aromatic polyamide resin, or a polyimide resin.

The thickness of the second resin layer 12b is set to, for example, 3 μm or more and 30 μm or less, and/or, for example, 1.5 times or more and 20 times or less the thickness of the first resin layer 12a. In addition, the elastic modulus of the second resin layer 12b is set to, for example, 0.2 GPa or more and 20 GPa or less, and/or, for example, 2 times or more and 100 times or less the elastic modulus of the first resin layer 12a. Further, the hardness of the second resin layer 12b is set to, for example, 0.05 GPa or more and 2 GPa or less, and/or, for example, 5 times or more and 20 times or less the hardness of the first resin layer 12a. Furthermore, the dielectric loss tangent of the second resin layer 12b is set to, for example, 0.01 or more and 0.02 or less, and the coefficient of thermal expansion in the thickness direction and the planar direction of the second resin layer 12b is set to, for example, 20 ppm/° C. or more and 50 ppm/° C. or less. Meanwhile, the thickness of the second resin layer 12b refers to a thickness on the top of the first resin layer 12a or the third resin layer 12c.

Moreover, in the embodiment, the second resin layer 12b includes a third filler 13c composed of a large number of third filler particles made of an inorganic insulating material. The third filler 13c can be made of a material similar to that constituting the first filler 13a, and can decrease the coefficient of thermal expansion of the second resin layer 12b and enhance the rigidity of the second resin layer 12b.

The second inorganic insulating layer 11b is connected to a second inorganic insulating layer 11b adjacent via the third resin layer 12c and the second resin layer 12b. Like the first inorganic insulating layer 11a included in the base 7 as described above, the second inorganic insulating layer 11b is made of an inorganic insulating material which is higher in rigidity but lower in coefficient of thermal expansion and dielectric loss tangent than a resin material. That is, the second inorganic insulating layer 11b affords the same effects as achieved by the first inorganic insulating layer 11a included in the base 7. In the case where the second inorganic insulating layer 11b is adjacent to the first inorganic insulating layer 11a, the second inorganic insulating layer 11b is connected to the first inorganic insulating layer 11a via the first resin layer 12a and the second resin layer 12b.

For example, the thickness of the second inorganic insulating layer 11b is set to, for example, 3 μm or more and 30 μm or less, and/or 0.5 time or more and 10 times or less (preferably, 0.8 time or more and 1.2 times or less) the thickness of the second resin layer 12b. As shown in FIG. 2B, the other parts of the configuration are the same as in the configuration of the first inorganic insulating layer 11a as described above.

The third resin layer 12c is interposed between the second inorganic insulating layer 11b and the conductive layer 15, and has the same configuration as the first resin layer 12a included in the base 7 as described above. Therefore, the third resin layer 12c affords the same effects as achieved by the first resin layer 12a included in the base 7.

The via conductor 16 provides connection between the conductive layers 15 spaced apart in the thickness direction. The via conductor 16 has the form of a column tapered toward the core substrate 5. The via conductor 16 can be made of a conductive material, for example, copper, silver, gold, aluminum, nickel, or chromium. For example, the coefficient of thermal expansion of the via conductor 16 is set to, for example, 14 ppm/° C. or more and 18 ppm/° C. or less.

(First and Second Inorganic Insulating Layers)

For example, when a stress such as a thermal stress resulting from the difference in coefficient of thermal expansion between the circuit board 3 and the electronic component 2 or a mechanical stress is applied to the circuit board 3, separation could occur between the first inorganic insulating layer 11a and the resin portion of the resin base 10 or the first resin layer 12a, or between the second inorganic insulating layer 11b and the second resin layer 12b or the third resin layer 12c.

In this regard, according to the embodiment, the elastic moduli of the first and second inorganic insulating layers 11a and 11b are set to be 45 GPa or less, and smaller than the elastic modulus of silica glass (about 72 GPa) which is a typical material made of amorphous silicon oxide. Therefore, the elastic moduli of the first and second inorganic insulating layers 11a and 11b can be rendered approximate to the elastic modulus of each of the resin portion of the resin base 10, the first resin layer 12a, the second resin layer 12b, and the third resin layer 12c that are made of a resin material which is generally smaller in elastic modulus than an inorganic insulating material. This makes it possible to reduce separation between the first inorganic insulating layer 11a and the resin portion of the resin base 10 or the first resin layer 12a, or between the second inorganic insulating layer 11b and the second resin layer 12b or the third resin layer 12c, and thereby obtain the circuit board 3 with excellent electrical reliability.

Moreover, as practiced in the embodiment, it is desirable that the elastic moduli of the first and second inorganic insulating layers 11a and 11b are set to be 10 GPa or more. By so doing, the elastic moduli of the first and second inorganic insulating layers 11a and 11b become higher than the elastic modulus of each of the resin portion of the resin base 10, the first resin layer 12a, the second resin layer 12b, and the third resin layer 12c. This makes it possible to enhance the rigidity of the circuit board 3. Moreover, the increase of the elastic moduli of the first and second inorganic insulating layers 11a and 11b which exhibit a lower coefficient of thermal expansion makes it possible to achieve further reduction in the coefficient of thermal expansion of the circuit board 3.

Moreover, in the embodiment, the hardness of the first and second inorganic insulating layers 11a and 11b are set to 0.5 GPa or more and 4 GPa or less.

(First and Second Inorganic Insulating Particles)

For example, when a stress such as a thermal stress resulting from the difference in coefficient of thermal expansion between the circuit board 3 and the electronic component 2 or a mechanical stress is applied to the circuit board 3, cracking could occur in the first and second inorganic insulating layers 11a and 11b due to separation between the first inorganic insulating particles 14a.

Meanwhile, in the circuit board 3 of the embodiment, the first and second inorganic insulating layers 11a and 11b include the second inorganic insulating particles 14b that have a larger particle diameter than that of the first inorganic insulating particles 14a. Therefore, even when cracking occurs in the first and second inorganic insulating layers 11a and 11b, it is possible to inhibit extension of cracks due to the second inorganic insulating particles 14b having a large particle diameter, or bypass the cracks along the surface of the second inorganic insulating particles when the cracks reach the second inorganic insulating particles 14b. As a result, the cracks are suppressed from penetrating the first or second inorganic insulating layers 11a or 11b and reaching the conductive layers 15, it is possible to reduce breaking in the conductive layer 15 which originates from the cracks, and, furthermore, to obtain the circuit board 3 with electrical reliability. In order to inhibit extension of cracks and bypass the cracks, a case of the particle diameter of the second inorganic insulating particles being 0.5 μm or more is particularly preferred.

In addition, since the second inorganic insulating particles 14b have a large particle diameter, when the first and second inorganic insulating layers 11a and 11b are constituted by the second inorganic insulating particles only, it becomes difficult to dispose a number of second inorganic insulating particles around one second inorganic insulating particle, consequently, the contact area between the second inorganic insulating particles 14b becomes small, and the adhesion strength between the second inorganic insulating particles 14b is liable to be decreased. In contrast to the above, in the circuit board 3 of the embodiment, the first and second inorganic insulating layers 11a and 11b include not only the second inorganic insulating particles 14b having a large particle diameter but also the first inorganic insulating particles 14a having a small particle diameter, and the second inorganic insulating particles are joined via a plurality of the first inorganic insulating particles 14a disposed around the second inorganic insulating particle. Therefore, it is possible to increase the contact area between the second inorganic insulating particles and the first inorganic insulating particles, and to reduce separation between the second inorganic insulating particles 14b. Such an effect becomes particularly significant in a case in which the particle diameter of the first inorganic insulating particles is set to 110 nm or less.

Meanwhile, in the circuit board 3 of the embodiment, the particle diameter of the first inorganic insulating particles 14a is set to a small particle diameter of 3 nm or more and 110 nm or less. Since the particle diameter of the first inorganic insulating particles 14a is extremely small as such, the first inorganic insulating particles 14a are strongly connected to each other at a temperature lower than the crystallization onset temperature. As a result, the first and second inorganic insulating particles themselves are connected as the two are in an amorphous state, and the first and second inorganic insulating layers 11a and 11b turn into an amorphous state. Therefore, the anisotropy of the coefficient of thermal expansion of the first and second inorganic insulating layers 11a and 11b is decreased as described above. Meanwhile, when the particle diameter of the first inorganic insulating particles 14a is set to a small particle diameter of 3 nm or more and 110 nm or less, it is assumed that atoms in the first inorganic insulating particles 14a, particularly, atoms on the surface move actively, and therefore the first inorganic insulating particles 14a are strongly connected even at a low temperature lower than the crystallization onset temperature. Meanwhile, the crystallization onset temperature is a temperature at which an amorphous inorganic insulating material begins to crystallize, that is, a temperature at which the volume of the crystalline phase region increases.

In addition, in the embodiment, each of the second inorganic insulating particles 14b is coated with a plurality of first inorganic insulating particles 14a so that the second inorganic insulating particles 14b are separated from each other. As a result, contact between the second inorganic insulating particles 14b that have a low adhesion strength and are liable to be separated is prevented, separation of the second inorganic insulating particles 14b can be suppressed, and, furthermore, it is possible to reduce occurrence and extension of cracks caused by the second inorganic insulating particles.

The first inorganic insulating particles 14a desirably have a spherical shape as in the embodiment. As a result, since a number of the first inorganic insulating particles 14a become liable to fill voids among the second inorganic insulating particles, the volume of the voids among the first inorganic insulating particles 14a is reduced, the inside structures of the first and second inorganic insulating layers 11a and 11b can become dense, and it is possible to improve the stiffness of the first and second inorganic insulating layers 11a and 11b.

In addition, the second inorganic insulating particles 14b desirably have a curved surface shape as in the embodiment, and, furthermore, more desirably have a spherical shape. As a result, the surfaces of the second inorganic insulating particles 14b become smooth, a stress on the surface is dispersed, and it is possible to reduce occurrence of cracks in the first and second inorganic insulating layers 11a and 11b which originate from the surfaces of the second inorganic insulating particles 14b.

The second inorganic insulating particle 14b should desirably be made higher in hardness than the first inorganic insulating particle 14a as in the embodiment. On one hand, by imparting lower hardness to the first inorganic insulating particle 14a, the hardnesses of the first and second inorganic insulating layers 11a and 11b decrease, and on the other hand, by imparting higher hardness to the second inorganic insulating particle 14b, even if cracks reach the second inorganic insulating particles 14b, the cracks are less liable to find its way into the second inorganic insulating particles 14b, with the consequent reduction of extension of cracks in the first and second inorganic insulating layers 11a and 11b. Moreover, the second inorganic insulating particle 14b should desirably be made higher in elastic modulus than the first inorganic insulating particle 14a as in the embodiment.

(Molecular Structures of First and Second Inorganic Insulating Particles)

It is known that amorphous silicon oxide assumes a multi-membered ring structure in which molecules are bound together in cyclic conformation. The multi-membered ring structure can be analyzed elaborately by means of Raman spectroscopy. For example, it is known that a peak value of Raman scattering intensity within a Raman shift range of 600 cm$^{-1}$ or more and 620 cm$^{-1}$ or less is indicative of the proportion of a three-membered ring structure to the multi-membered ring structure. Moreover, in amorphous silicon oxide, the value of Raman scattering intensity at Raman shift of 600 cm$^{-1}$ is greater than the value of Raman scattering intensity at the Raman shift of 620 cm$^{-1}$.

In this regard, according to the embodiment, the peak value of Raman scattering intensity within a Raman shift range of 600 cm$^{-1}$ or more and 620 cm$^{-1}$ or less is smaller than the value of Raman scattering intensity at the Raman shift of 600 cm$^{-1}$ in the first inorganic insulating particles 14a. That is, the first inorganic insulating particles 14a have a small proportion of the three-membered ring structure to the multi-membered ring structure. As a result, the first inorganic insulating particles 14a, being lower in density due to the small proportion of the three-membered ring structure in which molecules are densely arranged, are smaller in elastic modulus and hardness. By virtue of such a first inorganic insulating particle 14a, the elastic modulus and hardness of the first and second inorganic insulating layers 11a and 11b can be reduced.

Moreover, the first inorganic insulating particles 14a, having a small proportion of the three-membered ring structure to the multi-membered ring structure, can be connected to a resin material with higher adhesion strength. This is because, presumably, due to the small proportion of the three-membered ring structure, in the first inorganic insulating particles 14a, the region surrounded by cyclic conformation is wide enough for easy entrance of part of resin molecules, with the consequent enhancement in affinity between silicon oxide molecules and resin molecules. Accordingly, the provision of the first inorganic insulating particles 14a at the main surfaces of the first and second inorganic insulating layers 11a and 11b makes it possible to increase the strength of adhesion between the first and second inorganic insulating layers 11a and 11b and the resin portion of the resin base 10, the first resin layer 12a, the second resin layer 12b, and the third resin layer 12c.

It is desirable that the first inorganic insulating particles 14a have no peak of Raman scattering intensity within a Raman shift range of 600 cm$^{-1}$ or more and 620 cm$^{-1}$ or less.

The Raman scattering intensity of the first inorganic insulating particles 14a is measured by observing Raman spectrum produced through laser irradiation (wavelength: 514.53 nm) to the first inorganic insulating particles 14a using a laser Raman spectrometer. For example, a laser Raman spectrometer LabRAM HR-800 manufactured by HORIBA, Ltd. can be used for the measurement. In what follows, just as is the case with the first inorganic insulating particles 14a, Raman scattering intensity of the second inorganic insulating particles 14b is also measured.

Meanwhile, in the embodiment, a peak value of Raman scattering intensity within a Raman shift range of 600 cm$^{-1}$ or more and 620 cm$^{-1}$ or less in the second inorganic insulating particles 14b is greater than a peak value of Raman scattering intensity within a Raman shift range of 600 cm$^{-1}$ or more and 620 cm$^{-1}$ or less in the first inorganic insulating particles 14a. Accordingly, it is possible to make the proportion of the three-membered ring structure to the multi-membered ring structure in the second inorganic insulating particles 14b greater than that in the first inorganic insulating particles 14a, and furthermore, it is possible to make the second inorganic insulating particles 14b greater in elastic modulus and hardness than the first inorganic insulating particles 14a.

Moreover, it is desirable that, the peak value of Raman scattering intensity within a Raman shift range of 600 cm$^{-1}$ or more and 620 cm$^{-1}$ or less in the second inorganic insulating particles 14b is greater than the value of Raman scattering intensity at Raman shift of 600 cm$^{-1}$ in the second inorganic insulating particles 14b, as in the embodiment. As a result, it is possible to increase the proportion of the three-membered ring structure to the multi-membered ring structure in the second inorganic insulating particles 14b, and make elastic modulus and hardness of the second inorganic insulating particles 14b greater.

It is desirable that the second inorganic insulating particle 14b is connected, via the first inorganic insulating particle 14a, to the resin portion of the resin base 10, the first resin layer 12a, the second resin layer 12b, and the third resin layer 12c as in the embodiment. As a result, by virtue of the first inorganic insulating particle 14a having a smaller proportion of the three-membered ring structure to the multi-membered ring structure than the second inorganic insulating particle 14b and higher adhesion strength to a resin material, the strength of adhesion between the first and second inorganic insulating layers 11a and 11b and the resin portion of the resin base 10, the first resin layer 12a, the second resin layer 12b, and the third resin layer 12c can be increased. Meanwhile, the main surfaces of the first and second inorganic insulating layers 11a and 11b should desirably be composed solely of the first inorganic insulating particles 14a.

Moreover, with respect to the first and second inorganic insulating layers 11a and 11b, the peak value of Raman scattering intensity within a Raman shift range of 600 cm$^{-1}$ or more and 620 cm$^{-1}$ or less in the first and second inorganic insulating layers 11a and 11b is smaller than the peak value of Raman scattering intensity within a Raman shift range of 600 cm$^{-1}$ or more and 620 cm$^{-1}$ or less in the second inorganic insulating particles 14b. As a result, it is possible to make the first and second inorganic insulating layer 11a, 11b smaller in elastic modulus and hardness than the second inorganic insulating particles 14b.

Here, the Raman scattering intensity of the first and second inorganic insulating layers 11a and 11b is measured by observing Raman spectrum produced through laser irradiation (wavelength: 514.53 nm) to the surfaces of section of the first and second inorganic insulating layers 11a and 11b taken along the thickness direction using a laser Raman spectrometer LabRAM HR-800 manufactured by HORIBA, Ltd.

(Third and Fourth Inorganic Insulating Particles)

Figure 3:
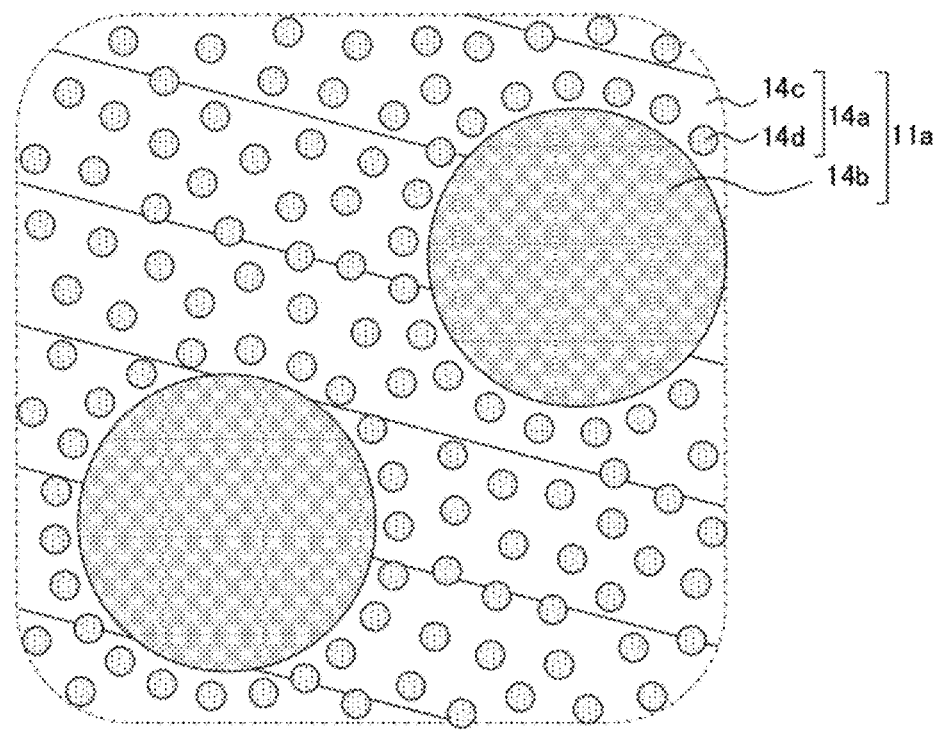
FIG. 3 is an enlarged cross-sectional view showing an R3 section of the mounting structure as shown in FIG. 1B.

In addition, in the circuit board 3 of the embodiment, the first inorganic insulating particles 14a include third inorganic insulating particles 14c whose particle diameter is set to 3 nm or more and 15 nm or less, and fourth inorganic insulating particles 14d whose particle diameter is set to 35 nm or more and 110 nm or less as shown in FIG. 3.

In this case, since the third inorganic insulating particles 14c are extremely small, the contact area between each of the third inorganic insulating particles 14c and other third inorganic insulating particles 14c or the fourth inorganic insulating particles 14d becomes large, and the third inorganic insulating particles or the third and fourth inorganic insulating particles can be strongly connected. In addition, even when the third inorganic insulating particles are separated, and cracks occur, extension of the cracks is favorably suppressed due to the fourth inorganic insulating particles 14d having a larger particle diameter than that of the third inorganic insulating particles 14c.

The first and second inorganic insulating layers 11a and 11b desirably include 10% by volume or more and 50% by volume or less of the third inorganic insulating particles 14c with respect to the total volume of the first inorganic insulating particles 14a and the second inorganic insulating particles 14b, and 10% by volume or more and 40% by volume or less of the fourth inorganic insulating particles 14d with respect to the total volume of the first inorganic insulating particles 14a and the second inorganic insulating particles 14b. When 10% by volume or more of the third inorganic insulating particles 14c are included, the third inorganic insulating particles 14c are disposed in gaps among the second inorganic insulating particles 14b and gaps among the second inorganic insulating particles 14b and the fourth inorganic insulating particles 14d at a high density, the third inorganic insulating particles 14c can be connected to each other, and occurrence and extension of cracks in such gaps can be reduced. In addition, when 10% by volume or more of the fourth inorganic insulating particles 14d are included, extension of cracks occurring in the gaps among the second inorganic insulating particles 14b can be favorably suppressed due to the fourth inorganic insulating particles 14d.

(First and Third Resin Layer)

Meanwhile, in the circuit board 3 of the embodiment, the first and third resin layers 12a and 12c are made smaller in thickness and smaller in elastic modulus than the second resin layer 12b. In this case, by the thin, and easily deformable first and third resin layers 12a and 12c, there is relaxed a thermal stress resulting from the difference in coefficient of thermal expansion between the first and second inorganic insulating layers 11a and 11b and the conductive layer 15. This makes it possible to suppress separation of the conductive layer 15 from the first and second inorganic insulating layers 11a and 11b, reduce breaking in the conductive layer 15, and furthermore, obtain the circuit board 3 with excellent electrical reliability. It is desirable that the first and third resin layers 12a and 12c are made smaller in thickness and smaller in elastic modulus than, in addition to the second resin layer 12b, the resin base 10, the first inorganic insulating layer 11a, and the second inorganic insulating layer 11b.

Moreover, the first and third resin layers 12a and 12c are interposed between the top surfaces of the first and second inorganic insulating layers 11a and 11b, respectively, and the bottom surface of the conductive layer 15. Therefore, in contrast to the second resin layer 12b which serves as an insulating member for effecting insulation between the conductive layers 15 that are adjacent to each other in the planar direction, the first and third resin layers 12a and 12c are not stringently required to have an increased thickness, and can thus be made smaller in thickness easily.

Moreover, the first and third resin layers 12a and 12c have higher adhesion strength to the first and second inorganic insulating layers 11a and 11b, as well as to the conductive layer 15, because of their smaller elastic moduli. Accordingly, it is possible to enhance the adhesion strength between the first and second inorganic insulating layers 11a and 11b and the conductive layer 15 by the first and third resin layers 12a and 12c.

Moreover, although the first and third resin layers 12a and 12c are smaller in elastic modulus and rigidity than the second resin layer 12b, their thickness is smaller than the thickness of the second resin layer 12b. Therefore, it follows that the thin first and third resin layers 12a and 12c exert little influence on the rigidity of the circuit board 3. This makes it possible to increase the rigidity of the circuit board 3.

Moreover, although the coefficients of thermal expansion of the first and third resin layers 12a and 12c tend to be higher than those of the first and second inorganic insulating layers 11a and 11b and the conductive layer 15, the first and third resin layers 12a and 12c are made to have a small thickness. Therefore, it follows that the thin first and third resin layers 12a and 12c exert little influence on the thermal expansion of the first and second inorganic insulating layers 11a and 11b and the conductive layer 15. This makes it possible to reduce separation between the first and second inorganic insulating layers 11a and 11b and the conductive layer 15.

Moreover, although the dielectric loss tangents of the first and third resin layers 12a and 12c tend to be greater than that of the first and second inorganic insulating layers 11a and 11b, the first and third resin layers 12a and 12c are made to have a small thickness. Therefore, by arranging the first and second inorganic insulating layers 11a and 11b having a lower dielectric loss tangent in the proximity of the conductive layer 15, it is possible to improve the signal transmission characteristics of the conductive layer 15.

Moreover, the second resin layer 12b is so configured as to lie between the conductive layers 15 spaced apart in the planar direction while making contact with the side surfaces of the conductive layers 15, thereby providing a function of enhancing insulation between the conductive layers 15. In order to ensure the insulation capability, the second resin layer 12b is, at least partly, disposed between the conductive layers 15 that are adjacent to each other in the planar direction, yet is made greater in thickness and elastic modulus than the first and third resin layers 12a and 12c. This makes it possible to increase the rigidity of the circuit board 3 while ensuring the insulation capability.

Moreover, the second resin layer 12b has a function of connecting together the first inorganic insulating layer 11a and the second inorganic insulating layer 11b that are spaced apart in the thickness direction thereof. In order to ensure the connecting capability, the second resin layer 12b is made larger in thickness than the conductive layer 15, yet is made higher in elastic modulus than the first and third resin layers 12a and 12c. This makes it possible to increase the rigidity of the circuit board 3 while ensuring the connecting capability.

It is desirable that the second resin layer 12b is lower in coefficient of thermal expansion than the first and third resin layers 12a and 12c as in the embodiment. As a result, by imparting a lower coefficient of thermal expansion to the second resin layer 12b having a larger thickness, it is possible to render the circuit board 3 lower in coefficient of thermal expansion.

Moreover, it is desirable that the second resin layer 12b is lower in dielectric loss tangent than the first and third resin layers 12a and 12c. As a result, by imparting a lower dielectric loss tangent to the second resin layer 12b making contact with the side surface and top surface of the conductive layer 15, it is possible to improve the signal transmission characteristics of the conductive layer 15.

As the resin material included in the first and third resin layers 12a and 12c, it is desirable to use a resin material which is smaller in elastic modulus but greater in coefficient of thermal expansion or in dielectric loss tangent than the resin material included in the second resin layer 12b. As a result, the first and third resin layers 12a and 12c can be made to have a smaller elastic modulus, whereas the second resin layer 12b can be made to have a lower coefficient of thermal expansion or dielectric loss tangent. As exemplary of a combination of resin materials for use, an epoxy resin can be used for the first and third resin layers 12a and 12c, and a polyphenylene ether resin, a polyphenylene oxide resin, or a fluorine resin can be used for the second resin layer 12b.

It is desirable that the second inorganic insulating filler 13b included in the first and third resin layers 12a and 12c is smaller than the first inorganic insulating filler 13a and the third inorganic insulating filler 13c in respect of its content in the resin material. As a result, the first and third resin layers 12a and 12c can be made to have a smaller elastic modulus, and the resin base 10 and the second resin layer 12b can be made to have a lower coefficient of thermal expansion or dielectric loss tangent.

In addition, It is desirable that the second inorganic insulating filler 13b is smaller in particle diameter than that of the first inorganic insulating filler 13a and the third inorganic insulating filler 13c. As a result, the first and third resin layers 12a and 12c can be made to have a smaller elastic modulus, and the resin base 10 and the second resin layer 12b can be made to have a lower coefficient of thermal expansion or dielectric loss tangent.

It is desirable that the first and third resin layer 12a and 12c are so configured that asperities in its main surface in contact with the first and second inorganic insulating layers 11a and 11b, respectively, is higher than that in its other main surface in contact with the conductive layer 15. In other words, it is desirable that the first and third resin layer 12a and 12c are so configured that its main surface in contact with the first and second inorganic insulating layers 11a and 11b, respectively, are greater in arithmetic average roughness (Ra) than the other main surface in contact with the conductive layer 15. As a result, in the interfaces between the first and third resin layers 12a and 12c, respectively, and the first and second inorganic insulating layers 11a and 11b, it is possible to increase adhesion strength to reduce separation. In the interfaces between the first and third resin layers 12a and 12c, respectively, and the conductive layer 15, it is possible to reduce short-circuiting between the adjacent conductive layers 15 due to remaining portion of the conductive material left in the depression of surface asperities at the time of formation of the conductive layer 15, and furthermore, make the wiring highly dense by arranging the conductive layers 15 close to each other.

Meanwhile, in the first and third resin layers 12a and 12c, the arithmetic average roughness of the main surface in contact with the first and second inorganic insulating layers 11a and 11b is set to, for example, 0.3 μm or more and 3 μm or less, whereas the arithmetic average roughness of the other main surface in contact with the conductive layer 15 is set to, for example, 0.01 μm or more and 0.3 μm or less. Moreover, in the first and third resin layers 12a and 12c, the arithmetic average roughness of the main surface in contact with the first and second inorganic insulating layers 11a and 11b is set to, for example 1.2 times or more and 3 times or less the arithmetic average roughness of the other main surface in contact with the conductive layer 15. Meanwhile, the arithmetic average roughness is determined according to ISO 4287:1997.

<Method for Manufacturing Circuit Board 3>

Figure 4:
FIGS. 4A to 4F are cross-sectional views of the circuit board cut in the thickness direction thereof which explain steps for manufacturing the circuit board as shown in FIG. 1.
Figure 4:
Figure 4:
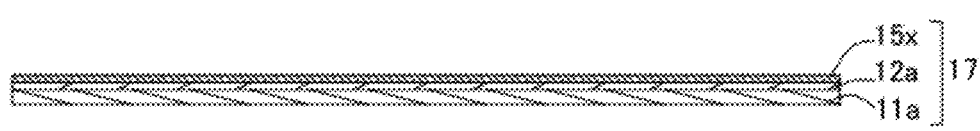
Figure 4:
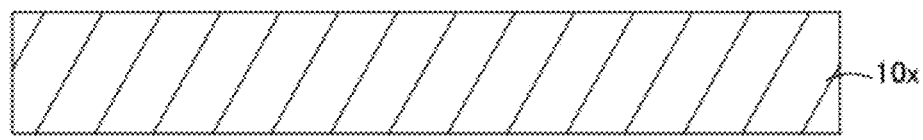
Figure 4:
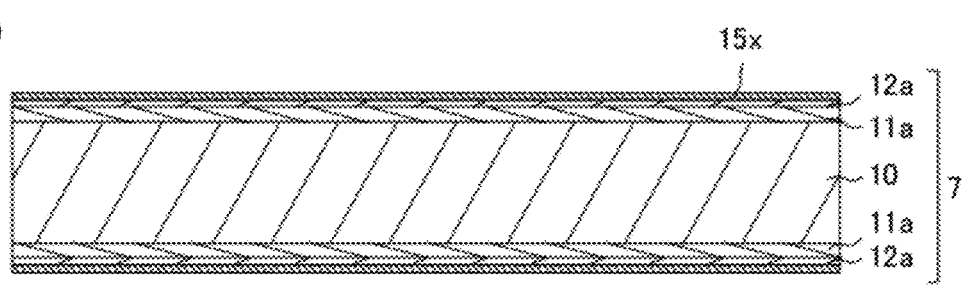
Figure 4:
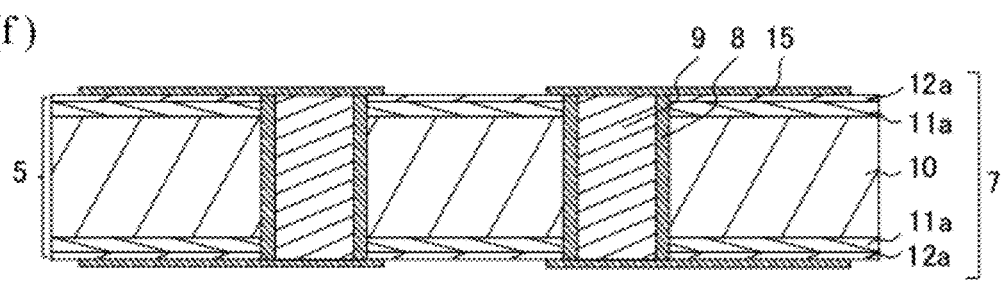
Figure 5:
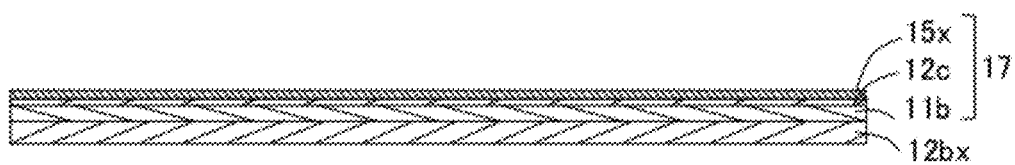
FIGS. 5A to 5C are cross-sectional views of the circuit board cut in the thickness direction thereof which explain steps for manufacturing the circuit board as shown in FIG. 1.
Figure 5:
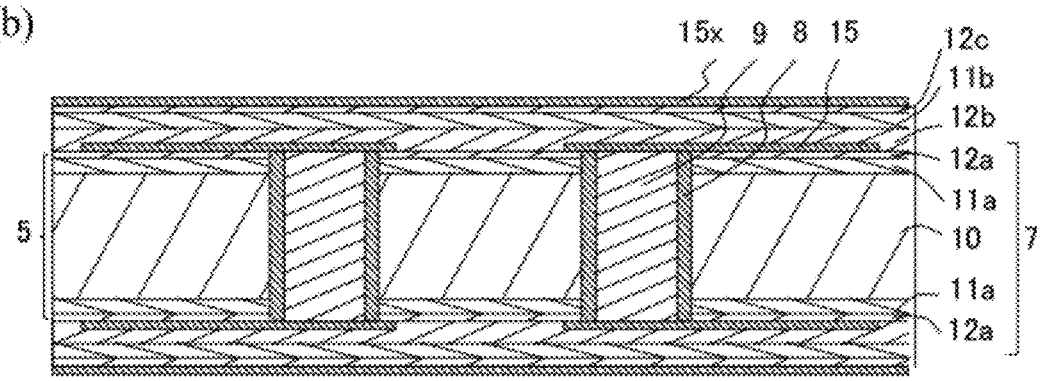
Figure 5:
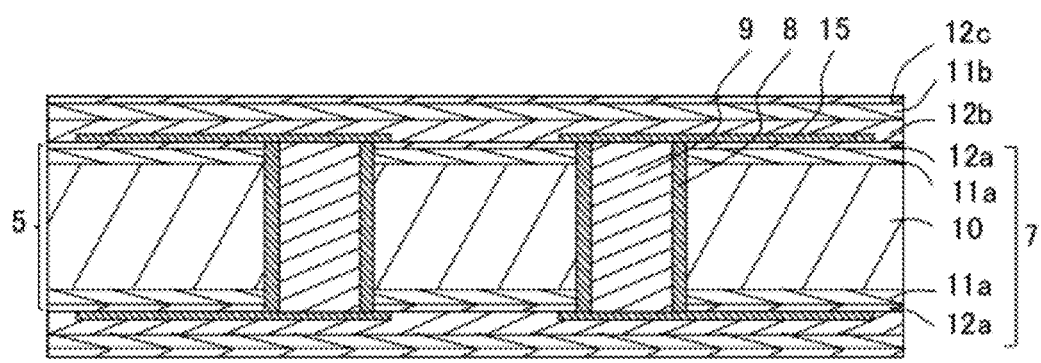
Figure 6:
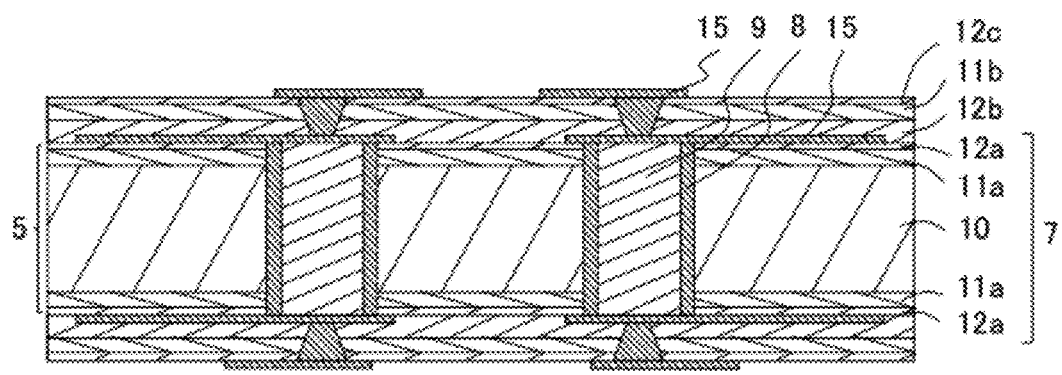
FIGS. 6A and 6B are cross-sectional views of the circuit board cut in the thickness direction thereof which explain steps for manufacturing the circuit board as shown in FIG. 1.
Figure 6:
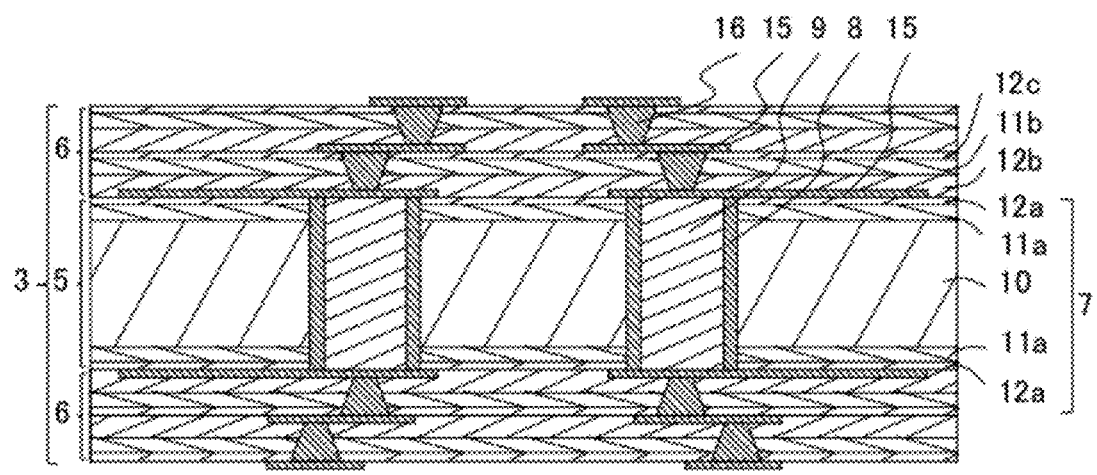

Next, a method for manufacturing the above circuit board 3 will be described based on FIGS. 4 to 6.

The method for manufacturing the circuit board 3 includes a production step of the core substrate 5 and a build-up step of the circuit layer 6.

(Production Step of Core Substrate 5)

An inorganic insulating sol 11x having a solid content that includes the first inorganic insulating particles 14a and the second inorganic insulating particles 14b, and a solvent is prepared.

The inorganic insulating sol 11x includes, for example, 10% by volume or more and 50% by volume or less of the solid content and 50% by volume or more and 90% by volume or less of the solvent. Thereby, it is possible to maintain the viscosity of the inorganic insulating sol 11x at a low level and to maintain the productivity of the inorganic insulating layers formed of the inorganic insulating sol 11x at a high level.

The solid content of the inorganic insulating sol 11x includes, for example, 20% by volume or more and 90% by volume or less of the first inorganic insulating particles 14a, and 10% by volume or more and 80% by volume or less of the second inorganic insulating particles 14b. Furthermore, the solid content includes, for example, 10% by volume or more and 50% by volume or less of the third inorganic insulating particles 14c that compose the first inorganic insulating particles 14a, and 10% by volume or more and 40% by volume or less of the fourth inorganic insulating particles 14d that compose the first inorganic insulating particles 14a. Thereby, it is possible to effectively reduce occurrence of cracks in the first inorganic insulating layers 11a in a step (3) as described below.

Meanwhile, the first inorganic insulating particles 14a can be produced by, for example, purifying a silicate compound, such as an aqueous solution of sodium silicate (water glass), and chemically precipitating silicon oxide. In this case, since the first inorganic insulating particles 14a can be produced under a low temperature condition, it is possible to produce the first inorganic insulating particles 14a in an amorphous state and having a small proportion of the three-membered ring structure. In addition, the particle diameter of the first inorganic insulating particles 14a is adjusted by adjusting the precipitation time of silicon oxide, specifically, the longer the precipitation time, the larger the particle diameter of the first inorganic insulating particles 14a becomes. Therefore, it is preferable to mix two kinds of inorganic insulating particles formed with mutually different precipitation times of silicon oxide in order to produce the first inorganic insulating particles 14a including the third inorganic insulating particles 14c and the fourth inorganic insulating particles 14d.

Meanwhile, in a case in which the second inorganic insulating particles 14b are composed of silicon oxide, the second inorganic insulating particles can be produced by, for example, purifying a silicate compound, such as an aqueous solution of sodium silicate (water glass), spraying a solution having silicon oxide chemically precipitated therein to a flame, and heating the sprayed solution at 800° C. or higher and 1500° C. or lower while formation of aggregated substances is decreased. Therefore, since the second inorganic insulating particles 14b have a larger particle diameter than that of the first inorganic insulating particles 14a, formation of aggregates during high-temperature heating is easily reduced, the second inorganic insulating particles can be easily produced by high-temperature heating, and, furthermore, the proportion of the three-membered ring structure can be increased and the hardness can be easily increased.

In addition, the heating time is desirably set to 1 second or more and 180 seconds or less when the second inorganic insulating particles 14b are produced. As a result, it is possible to suppress crystallization of the second inorganic insulating particles 14b and to maintain the amorphous state by shortening the heating time even in a case in which the solution is heated at 800° C. or higher and 1500° C. or lower.

Meanwhile, as the solvent included in the inorganic insulating sol 11x, an organic solvent including, for example, methanol, isopropanol, n-butanol, ethylene glycol, ethylene glycol monopropyl ether, methyl ethyl ketone, methyl isobutyl ketone, xylene, propylene glycol monomethyl ether, propylene glycol monomethyl ether acetate, dimethylacetamide, and/or a mixture of two kinds or more of those selected above can be used. Among them, an organic solvent including methanol, isopropanol or propylene glycol monomethyl ether is desirable. As a result, the inorganic insulating sol 11x can be uniformly applied, and therefore the solvent can be favorably evaporated in the step (3) as described below.

(2) Next, as shown in FIGS. 4A and 4B, a resin-attached metal foil having the first resin layer 12a and a metal foil 15x made of an conductive material such as copper, is prepared, and the inorganic insulating sol 11x is applied, in the form of a layer, to one main surface of the first resin layer 12a.

The resin-attached metal foil can be formed by applying a resin varnish to the metal foil 15x using a bar coater, a die coater, a curtain coater, or the like, and drying the resin varnish. The first resin layer 12a formed in the present step is, for example, B-stage or C-stage.

The inorganic insulating sol 11x can be applied using, for example, a dispenser, a bar coater, a die coater, or screen printing. At this time, since the solid content of the inorganic insulating sol 11x is set to 50% by volume or less as described above, the viscosity of the inorganic insulating sol 11x is set to be low, and the flatness of the applied inorganic insulating sol 11x can be increased.

In addition, since the particle diameter of the first inorganic insulating particles 14a is set to 3 nm or more as described above, the viscosity of the inorganic insulating sol 11x is favorably reduced, and the flatness of the applied inorganic insulating sol 11x can be improved due to the above fact.

(3) Subsequently, the inorganic insulating sol 11x is dried, and the solvent is evaporated.

Here, the inorganic insulating sol 11x is shrunk in accordance with the evaporation of the solvent, and the solvent is included in gaps between the first and second inorganic insulating particles 14a and 14b, but not in the first and second inorganic insulating particles 14a and 14b themselves. Therefore, when the inorganic insulating sol 11x includes the second inorganic insulating particles 14b having a large particle diameter, regions filled with the solvent are decreased accordingly, and the amount of the inorganic insulating sol 11x shrunk during the evaporation of the solvent in the inorganic insulating sol 11x is decreased. That is, the shrinkage of the inorganic insulating sol 11x is restricted by the second inorganic insulating particles 14b. As a result, it is possible to reduce occurrence of cracking caused by the shrinkage of the inorganic insulating sol 11x. In addition, even when cracks occur, it is possible to hinder extension of the cracks through the second inorganic insulating particles 14b having a large particle diameter.

Furthermore, since the plurality of first inorganic insulating particles 14a include the fourth inorganic insulating particles 14d having a large particle diameter and the third inorganic insulating particles 14c having a small particle diameter, the shrinkage of the inorganic insulating sol 11x in the gaps among the second inorganic insulating particles 14b is also restricted by the fourth inorganic insulating particles 14d, and occurrence of cracks in the gaps among the second inorganic insulating particles 14b is further reduced.

The inorganic insulating sol 11x is dried by, for example, heating and air drying. The drying temperature is set to, for example, 20° C. or higher and lower than the boiling point of the solvent (in a case in which two kinds or more of solvents are included in a mixed state, the boiling point of a solvent having the lowest boiling point), and the drying time is set to, for example, 20 seconds or more and o 30 minutes or less. As a result, boiling of the solvent is reduced, loss of the first and second inorganic insulating particles 14a and 14b due to the pressure of air bubbles generated during the boiling is suppressed, and the distribution of the particles can become more uniform.

(4) The solid content of the remaining inorganic insulating sol 11x is heated, and the first inorganic insulating layer 11a is formed using the inorganic insulating sol 11x. As a result, a laminate sheet 17 having the metal foil 15x, the first resin layer 12a and the first inorganic insulating layer 11a as shown in FIG. 4C is produced.

Here, the inorganic insulating sol 11x of the embodiment has the first inorganic insulating particles 14a whose particle diameter is set to 110 nm or less. As a result, the first inorganic insulating particles 13a can be strongly connected to each other even when the heating temperature of the inorganic insulating sol 11x is a relatively low temperature, for example, a low temperature lower than the crystallization onset temperatures of the first inorganic insulating particles 14a and the second inorganic insulating particles 14b. Meanwhile, the temperature at which the first inorganic insulating particles 14a can be strongly connected to each other is, for example, approximately 250° C. in a case in which the particle diameter of the first inorganic insulating particles 14a is set to 110 nm or less, and approximately 150° C. in a case in which the particle diameter is set to 15 nm or less. In addition, the crystallization onset temperatures of the first and second inorganic insulating particles 14a and 14b are approximately 1300° C.

In addition, in the first embodiment, the heating temperature of the inorganic insulating sol 11x is set to a temperature lower than the thermal decomposition onset temperature of the first resin layer 12a. As a result, it is possible to suppress degradation of the characteristics of the first resin layer 12a. Meanwhile, in a case in which the first resin layer 12a is composed of an epoxy resin, the thermal decomposition onset temperature is approximately 280° C. In addition, the thermal decomposition onset temperature is a temperature at which the mass of the resin is decreased by 5% in a thermogravimetric measurement according to ISO 11358: 1997.

In addition, the heating temperature of the inorganic insulating sol 11x is desirably the boiling point of the solvent or higher in order to evaporate the remaining solvent. In addition, the heating temperature is desirably set to a temperature lower than the crystallization onset temperatures of the first inorganic insulating particles 14a and the second inorganic insulating particles 14b. In this case, it is possible to reduce the crystallization of the first inorganic insulating particles 14a and the second inorganic insulating particles 14b, and to increase the proportion of the amorphous state. As a result, it is possible to reduce shrinkage of the crystallized first inorganic insulating layers 11a due to phase transition, and to reduce occurrence of cracks in the first inorganic insulating layers 11a.

Meanwhile, the inorganic insulating sol 11x is heated, for example, under the atmosphere with a temperature set to, for example, 100° C. or higher and lower than 220° C. and a time set to, for example, 0.5 hour or more and 24 hours or less. Meanwhile, in a case in which the heating temperature is 150° C. or higher, in order to suppress oxidation of the metal foil 15x, it is desirable to heat the inorganic insulating sol 11x under a vacuum, an inert atmosphere, such as argon, or a nitrogen atmosphere.

(5) A resin base precursor 10x as shown in FIG. 4D is prepared, and the laminate sheets 17 are laminated on the top and bottom surfaces of the resin base precursor 10x.

The resin base precursor 10x can be produced by, for example, laminating a plurality of resin sheets including an uncured thermosetting resin and a base member. Meanwhile, the uncured refers to a state of A-stage or B-stage according to ISO 472:1999.

The laminate sheets 17 are laminated so as to have the first inorganic insulating layer 11a interposed between the metal foil 15x as well as the second resin layer 12a and the resin base precursor 10x.

(6) Next, the resin base precursor 10x is cured by heating and pressurizing the laminated body in the vertical direction so as to form the resin base 10 as shown in FIG. 4E.

The heating temperature of the laminated body is set to the curing onset temperature or higher and lower than the thermal decomposition temperature of the resin base precursor 10x. Specifically, in a case in which the first resin precursor sheet is composed of an epoxy resin, a cyanate resin, a bismaleimide triazine resin, or a polyphenylene ether resin, the heating temperature is set to, for example, 170° C. or higher and 230° C. or lower. In addition, the pressure of the laminated body is set to, for example, 2 MPa or more and 3 MPa or less, and the heating time and the pressurizing time are set to, for example, 0.5 hour or more and 2 hours or less. Meanwhile, the curing onset temperature is a temperature at which a resin turns into a state of C-stage according to ISO 472:1999. In addition, the thermal decomposition temperature is a temperature at which the mass of a resin is decreased by 5% in thermogravimetric measurement according to ISO 11358:1997.

(7) As shown in FIG. 4F, the through hole conductors 8 that penetrate the base 7 in the thickness direction and the insulating bodies 9 inside the through hole conductors 8 are formed, and then the conductive layers 15 connected to the through hole conductors 8 are formed on the base 7.

The through hole conductor 8 and the insulating body 9 are formed as follows. Firstly, a plurality of through holes that penetrate the base 7 and the metal foil 15x in the thickness direction are formed by, for example, a drilling process, a laser processing, or the like. Next, a conductive material is coated with the inner wall of the through hole by, for example, electroless plating, vapor deposition, CVD, sputtering, or the like, thereby forming the cylindrical through hole conductor 8. Next, a resin material and the like are filled in the cylindrical through hole conductor 8 so as to form the insulating body 9.

In addition, the conductive layer 15 is formed by coating a metal layer composed of the same metallic material as for the metal foil 15x on the insulating body 9 and the through hole conductor 8 exposed through the through holes formed in the metal foil 15x by, for example, electroless plating, vapor deposition, CVD, sputtering, or the like, and, subsequently, patterning the metal foil 15x and/or the metallic layer using photolithography technique, etching, or the like. Meanwhile, the conductive layer 15 may be formed by firstly separating the metal foil 15x, then, forming the metallic layer on the base 7, and patterning the metallic layer.

The core substrate 5 can be produced in the above manner.

(Build-up Step of Circuit Layer 6)

(8) After the resin precursor sheet 10bx and the laminate sheet 17 having the metal foil 15x, the third resin layer 12c and the second inorganic insulating layer 11b are newly prepared, the laminate sheet 17 is laminated on the resin precursor sheet 10bx as shown in FIG. 5A.

The resin precursor sheet 10bx is formed of the uncured thermosetting resin as described above which composes the second resin layer 12b.

In addition, the laminate sheet 17 is produced in accordance with steps similar to the steps (1) to (4), and is placed on the resin precursor sheet 10bx so as to have the second inorganic insulating layer 11b interposed between the resin precursor sheet 10bx as well as the metal foil 15x and the third resin layer 12c.

(9) Next, the laminate sheets 17 are laminated on the top and bottom surfaces of the core substrate 5 respectively through the resin precursor sheets 10bx.

(10) The laminated body of the core substrate 5 and the laminate sheet 17 is heated and pressurized in the vertical direction so as to cure the thermosetting resin of the resin precursor sheet 10bx and make the resin precursor sheet 10bx into the second resin layer 12b as shown in FIG. 5B.

Meanwhile, the laminate can be heated and pressurized in the same manner as, for example, in the step (6).

(11) As shown in FIG. 5C, the metal foil 15x is separated from the third resin layer 12c by etching in which, for example, a liquid mixture of sulfuric acid and hydrogen peroxide, a ferric chloride solution, a copper chloride solution, or the like is used.

(12) As shown in FIG. 6A, the via conductors 16 that penetrate the second resin layer 12b and the second inorganic insulating layer 11b in the thickness direction thereof are formed, and the conductive layers 15 are formed on the second inorganic insulating layer 11b.

The via conductor 16 and the conductive layer 15 are formed specifically as follows. Firstly, the via holes that penetrate the second resin layer 12b, the second inorganic insulating layer 11b and the third resin layer 12c are formed using, for example, a YAG laser apparatus or a carbon dioxide laser apparatus. Next, the via conductor 16 is formed in the via hole by, for example, the semi additive method, the subtractive method, the full additive method, or the like, and a conductive material is coated on the third resin layer 12c so as to form the conductive layer 15. Meanwhile, the conductive layer 15 may be formed by patterning the metal foil 13 without separating the metal foil 13 in the step (11).

(13) As shown in FIG. 6B, the circuit layers 6 are formed on the top and bottom of the core substrate 5 by repeating the steps (8) to (12). Meanwhile, the circuit layer 6 can be multilayered by repeating the present steps.

The circuit board 3 can be manufactured as described above. Meanwhile, the electronic component 2 is flip-mounted on the manufactured circuit board 3 via the bumps 4, whereby a mounting structure 1 as shown in FIG. 1A can be produced.

Meanwhile, the electronic component 2 may be electrically connected with the circuit board 3 by wire bonding, or may be housed in the circuit board 3.

The invention is not limited to the above embodiments, and a variety of alterations, improvements, combinations, and the like are permitted within the scope of the purport of the invention.

In the above embodiments, examples in which the invention is applied to the circuit board have been described, but the invention can be applied not only to the circuit board but also to all structures having inorganic insulating layers as described above. For example, the invention can also be applied to chassis of electronic devices, such as mobile phones. In this case, the inorganic insulating layer is used as an abrasion-resistant protective film that protects the chassis. In addition, the invention can also be used for windows used in automobiles or houses. In this case, the inorganic insulating layer can be used as a transparent and abrasion-resistant membrane that coats the window surfaces, and, consequently, it is possible to suppress reduction of the transparency which is caused by damage on the surfaces of window materials. In addition, the invention can also be used for metal molds that are used for die casting. In this case, the inorganic insulating layer can be used as an abrasion-resistant membrane or an insulating film that coats the surfaces of metal molds. In addition, particularly, the inorganic insulating layer can be used as porous bodies for filters which coat the surfaces of filters formed of a resin fiber or the like. In this case, the inorganic insulating layer can be used for catalyst carriers of gasoline engines or dust removal filters for diesel engines.

In addition, in the embodiments of the invention as described above, the build-up multilayer substrate composed of a core substrate and circuit layers has been described as an example of the circuit board according to the invention, but examples of the circuit board of the invention include not only the build-up multilayer substrate but also an interposer substrate, a single layer substrate composed of only a coreless substrate or a core substrate, a ceramic substrate, a metal substrate, and a core substrate including a metal plate.

In addition, in the embodiments of the invention as described above, the inorganic insulating layer includes the first inorganic insulating particles and the second inorganic insulating particles, but the inorganic insulating layer may include only the first inorganic insulating particles without including the second inorganic insulating particles, and may include inorganic insulating particles having a different particle diameter from the first inorganic insulating particles and the second inorganic insulating particles.

In addition, in the embodiments of the invention as described above, the first inorganic insulating particles include the third inorganic insulating particles and the fourth inorganic insulating particles, but the first inorganic insulating particles may only include any one of the third inorganic insulating particles and the fourth inorganic insulating particles. In this case, the first inorganic insulating particles desirably include the third inorganic insulating particles only in view of a connecting strength.

In addition, in the embodiments of the invention as described above, the resin portion of the resin base and the second resin layer are formed of a thermosetting resin, but at least one or both of the resin portion of the resin base and the second resin layer may also be formed of a thermosetting resin. Examples of the thermosetting resin that can be used include a fluororesin, an aromatic liquid crystal polyester resin, a polyether ketone resin, a polyphenylene ether resin, and a polyimide resin.

In addition, in the embodiments of the invention as described above, the circuit board includes the first resin layer and the third resin layer, but the circuit board does not necessarily have to include the first resin layer and the third resin layer. In this case, the conductive layer is formed on the first inorganic insulating layer, as well as on the second inorganic insulating layer. In addition, in the step (2), the inorganic insulating sol is coated on the metal foil.

In addition, in the embodiments of the invention as described above, the first and third resin layers are designed to be smaller in elastic modulus than the second resin layer, but the first and third resin layers may have the same elastic modulus as that of the second resin layer. In this case, for example, layers made of identical resin materials can be used as the first and third resin layers and the second resin layer.

In addition, in the embodiments of the invention as described above, both the core substrate and the circuit layer have the inorganic insulating layers, but the circuit board may have at least any one of the core substrate and the circuit layer include the inorganic insulating layers.

In addition, in the embodiments of the invention as described above, the evaporation of the solvent in the step (3) and the heating of the solvent in the step (4) are carried out separately, but the steps (3) and (4) may be carried out at the same time.

In addition, in the embodiments of the invention as described above, the uncured resin precursor sheet is placed on the second inorganic insulating layer in the step (6), but the uncured liquid-phase resin layer precursor may be applied to the second inorganic insulating layer.

EXAMPLES

Hereinafter, the invention will be described in detail using examples, but the invention is not limited to the following examples, and any alteration and embodiments within the scope of the purport of the invention are included in the scope of the invention.

<Structure, Elastic Modulus, and Hardness of Inorganic Insulating Layer>

(Evaluation Method)

A laminated plate having the metal foil, the first inorganic insulating layer composed of inorganic insulating particles, and the resin base was produced, a polished cross section of the laminated plate which was cut in the thickness direction thereof was photographed using a field emission scanning electron microscope (manufactured by JEOL Ltd., JSM-7000F), and the structure of the first inorganic insulating layer was observed.

In addition, following the cutting of the laminated plate along the thickness direction and the subsequent section polishing using argon ion, the elastic modulus and hardness of the first inorganic insulating layer have been measured, using Nano Indenter XP manufactured by MTS Systems Corporation, by pressing the indenter of the Nano Indenter against part of the polished surface of section which is made up by the first inorganic insulating layer. In addition, silica glass was prepared, and its elastic modulus and hardness have been measured, using Nano Indenter XP manufactured by MTS Systems Corporation, by pressing the indenter of the Nano Indenter against the silica glass.

(Conditions for Producing Laminated Plate)

Firstly, a second inorganic insulating sol including a first inorganic insulating sol that included the first inorganic insulating particles and the second inorganic insulating particles was prepared.

As the first inorganic insulating sol, Any of PGM-ST, MIBK-ST, MIBK-SZC, MIBK-SD, MEK-AC-2101, MEK-EC-2102, IPA-ST-ZL, and IPA-ST-L manufactured by Nissan Chemical Industries. Ltd., and QUARTRON PL-1-IPA, QUARTRON PL-2L-PGME, and QUARTRON SP-03F manufactured by Fuso Chemical Co., Ltd., was used.

In addition, as the second inorganic insulating sol, any of QUARTRON SP-1B manufactured by Fuso Chemical Co., Ltd., DF SFP-20M, DF SFP-30M, and DF SFP-130MC manufactured by DENKA (Denki Kagaku Kogyo Kabushiki Kaisya), and HIPRESICA FQ N2N manufactured by Ube Nitto Kasei Co., Ltd. was used.

Next, the first inorganic insulating sol and the second inorganic insulating sol were combined into a predetermined amount, fed into a plastic container, stirred using plastic balls, and uniformly mixed.

Inorganic insulating sols of Samples 1 to 37 were prepared by the above method. The inorganic insulating sols of Samples 1 to 37 include the first inorganic insulating particles and the second inorganic insulating particles having the particle diameters and solid content ratios (% by volume in the solid content) as shown in Table 1, and 45% by weight to 71% by weight of the solvent. Meanwhile, Sample 38 shown in Table 1 is silica glass.

Next, the inorganic insulating sols of Samples 1 to 37 were applied onto the metal foil or onto the first resin layer of the resin-attached metal foil. The first resin layer was formed of an epoxy resin.

Next, the inorganic insulating sols were heated under conditions of temperature: 150° C., time: 2 hours, and atmosphere: the atmosphere, and the solvent was evaporated, thereby producing laminate sheets.

Next, the laminate sheets were laminated on the top and bottom surfaces of the resin base precursor including the uncured thermosetting resin, and the laminate was heated and pressed under conditions of time: 1 hour, pressure: 3 MPa, and temperature: 180° C., thereby making the resin base precursor into the resin base so as to produce a laminated plate.

TABLE 1

| Sample | First inorganic insulating particles | | | | | | Second inorganic insulating particles | | | Elastic modulus (GPa) | Hardness (GPa) |
|---|---|---|---|---|---|---|---|---|---|---|---|
| | Product name | Average particle diameter | Solid content proportion (vol. %) | Product name | Average particle diameter | Solid content proportion (vol. %) | Product name | Average particle diameter | Solid content proportion (vol. %) | | |
| 1 | PGM-ST | 10-15 nm | 100 | | | | | | | 18.5 | 0.9 |
| 2 | PGM-ST | 10-15 nm | 50 | | | | QUARTRON SP-1B | 1 μm | 50 | | |
| 3 | PGM-ST | 10-15 nm | 60 | | | | HIPRESICA FQ N2N | 2 μm | 40 | | |
| 4 | PGM-ST | 10-15 nm | 25 | IPA-ST-ZL | 70-100 nm | 25 | QUARTRON SP-1B | 1 μm | 50 | | |
| 5 | PGM-ST | 10-15 nm | 25 | IPA-ST-ZL | 70-100 nm | 25 | QUARTRON SP-1B | 1 μm | 50 | 17.9 | 2.1 |
| 6 | PGM-ST | 10-15 nm | 20 | IPA-ST-ZL | 70-100 nm | 20 | QUARTRON SP-1B | 1 μm | 60 | 14.8 | 1.8 |
| 7 | PGM-ST | 10-15 nm | 17.5 | IPA-ST-ZL | 70-100 nm | 17.5 | QUARTRON SP-1B | 1 μm | 65 | 28.8 | 2.3 |
| 8 | PGM-ST | 10-15 nm | 15 | IPA-ST-ZL | 70-100 nm | 15 | QUARTRON SP-1B | 1 μm | 70 | 23.3 | 2.2 |
| 9 | PGM-ST | 10-15 nm | 12.5 | IPA-ST-ZL | 70-100 nm | 12.5 | QUARTRON SP-1B | 1 μm | 75 | | |
| 10 | PGM-ST | 10-15 nm | 10 | IPA-ST-ZL | 70-100 nm | 10 | QUARTRON SP-1B | 1 μm | 80 | 23.3 | 1.8 |
| 11 | PGM-ST | 10-15 nm | 26.67 | IPA-ST-ZL | 70-100 nm | 13.33 | QUARTRON SP-1B | 1 μm | 60 | 25 | 2.4 |
| 12 | PGM-ST | 10-15 nm | 20 | IPA-ST-L | 40-150 nm | 20 | QUARTRON SP-1B | 1 μm | 60 | 18.3 | 1.7 |
| 13 | QUARTRON PL-1-IPA | 10-15 nm | 20 | QUARTRON PL-2L-PGME | 15-20 nm | 20 | QUARTRON SP-1B | 1 μm | 60 | 10.8 | 1.1 |
| 14 | QUARTRON PL-1-IPA | 10-15 nm | 15 | QUARTRON PL-2L-PGME | 15-20 nm | 15 | QUARTRON SP-1B | 1 μm | 70 | 15.6 | 1.4 |
| 15 | PGM-ST | 10-15 nm | 13.3 | IPA-ST-ZL | 70-100 nm | 26.7 | QUARTRON SP-1B | 1 μm | 60 | 19.6 | 2.3 |
| 16 | PGM-ST | 10-15 nm | 15 | IPA-ST-ZL | 70-100 nm | 15 | QUARTRON SP-1B | 1 μm | 70 | 26.3 | 2 |
| 17 | PGM-ST | 10-15 nm | 12.5 | IPA-ST-ZL | 70-100 nm | 12.5 | QUARTRON SP-1B | 1 μm | 75 | 29.2 | 2.3 |
| 18 | PGM-ST | 10-15 nm | 20 | IPA-ST-ZL | 70-100 nm | 20 | QUARTRON SP-1B | 1 μm | 60 | 27 | 2.2 |
| 19 | PGM-ST | 10-15 nm | 23.3 | IPA-ST-ZL | 70-100 nm | 11.7 | QUARTRON SP-1B | 1 μm | 65 | 25.6 | 2 |
| 20 | PGM-ST | 10-15 nm | 20 | IPA-ST-ZL | 70-100 nm | 20 | QUARTRON SP-1B | 1 μm | 60 | 39.4 | 2.9 |
| 21 | PGM-ST | 10-15 nm | 20 | IPA-ST-ZL | 70-100 nm | 20 | HIPRESICA FQ N2N | 2 μm | 60 | 38.9 | 3.4 |
| 22 | PGM-ST | 10-15 nm | 20 | IPA-ST-ZL | 70-100 nm | 20 | DF SFP-20M | 0.4 μm | 60 | 33.1 | 2.3 |
| 23 | QUARTRON PL-1-IPA | 10-15 nm | 20 | QUARTRON PL-2L-PGME | 15-20 nm | 20 | DF SFP-20M | 0.4 μm | 60 | 20.8 | 1.4 |
| 24 | PGM-ST | 10-15 nm | 20 | IPA-ST-ZL | 70-100 nm | 20 | DF SFP-20M | 0.4 μm | 60 | 31.8 | 2.2 |
| 25 | MIBK-ST | 10-15 nm | 30 | | | | QUARTRON SP-1B | 1 μm | 70 | 30 | 2.3 |
| 26 | MIBK-SZC | 10-15 nm | 30 | | | | QUARTRON SP-1B | 1 μm | 70 | 23.9 | 1.3 |
| 27 | MIBK-SD | 10-15 nm | 30 | | | | QUARTRON SP-1B | 1 μm | 70 | 27.2 | 2.2 |
| 28 | MEK-AC-2101 | 10-15 nm | 30 | | | | QUARTRON SP-1B | 1 μm | 70 | 25.1 | 1.7 |
| 29 | MEK-EC-2102 | 10-15 nm | 30 | | | | QUARTRON SP-1B | 1 μm | 70 | 25.8 | 1.7 |
| 30 | MIBK-ST | 10-15 nm | 20 | QUARTRON SP-03F | 0.3 μm | 10 | QUARTRON SP-1B | 1 μm | 70 | 26.2 | 1.6 |
| 31 | MIBK-ST | 10-15 nm | 20 | QUARTRON SP-03F | 0.3 μm | 20 | QUARTRON SP-1B | 1 μm | 60 | 27.1 | 1.6 |
| 32 | MIBK-SZC | 10-15 nm | 30 | | | | DF SFP-130MC | 0.6 μm | 70 | 27.2 | 1.8 |
| 33 | MIBK-SZC | 10-15 nm | 30 | | | | DF SFP-30M | 0.6 μm | 70 | 27.6 | 1.8 |
| 34 | MIBK-ST | 10-15 nm | 30 | | | | DF SFP-20M | 0.4 μm | 70 | 25.3 | 1.8 |
| 35 | MIBK-SZC | 10-15 nm | 15 | MIBK-ST | 10-15 nm | 15 | DF SFP-20M | 0.4 μm | 70 | 22.5 | 1.5 |

TABLE 1-continued

| | | First inorganic insulating particles | | | | Second inorganic insulating particles | | | | | |
|---|---|---|---|---|---|---|---|---|---|---|---|
| Sample | Product name | Average particle diameter | Solid content proportion (vol. %) | Product name | Average particle diameter | Solid content proportion (vol. %) | Product name | Average particle diameter | Solid content proportion (vol. %) | Elastic modulus (GPa) | Hardness (GPa) |
| 36 | MIBK-ST | 10-15 nm | 100 | | | | | | | 13.3 | 0.6 |
| 37 | MIBK-STZ | 10-15 nm | 100 | | | | | | | 13 | 0.7 |
| 38 | | | | | | | | | | 71.9 | 10.1 |

(Structure of First Inorganic Insulating Layer)

Figure 7:
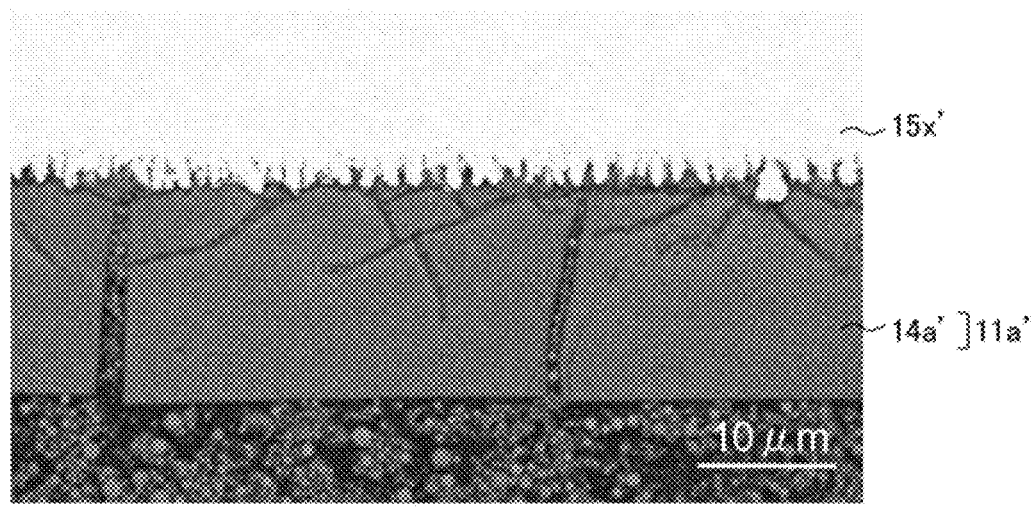
FIGS. 7A and 7B are photographs of a part of a cross section of a laminated plate of Sample 1 cut in a thickness direction thereof, which is taken using a field emission scanning electron microscope.
Figure 7:
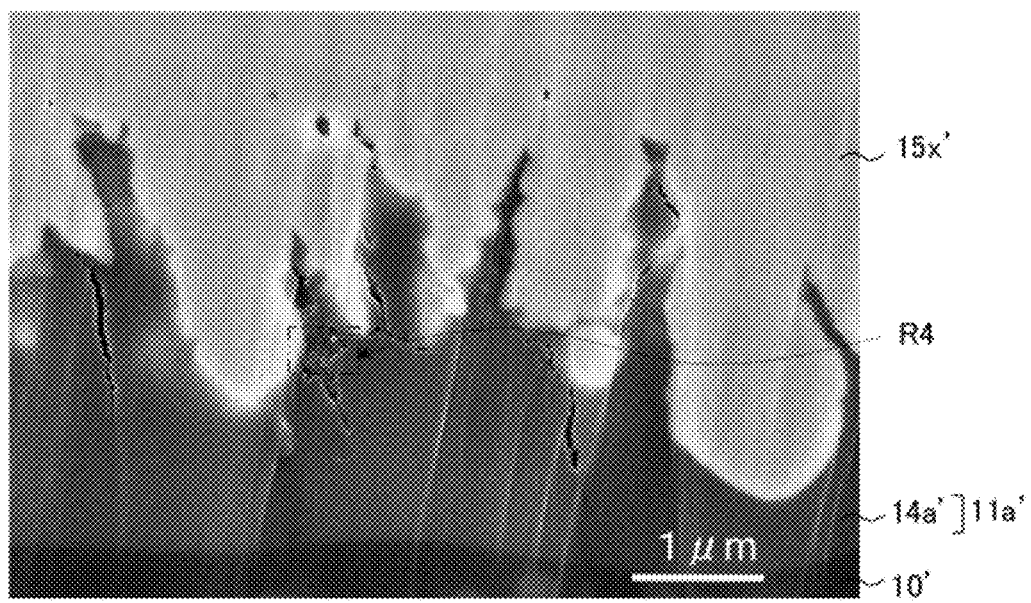
Figure 8:
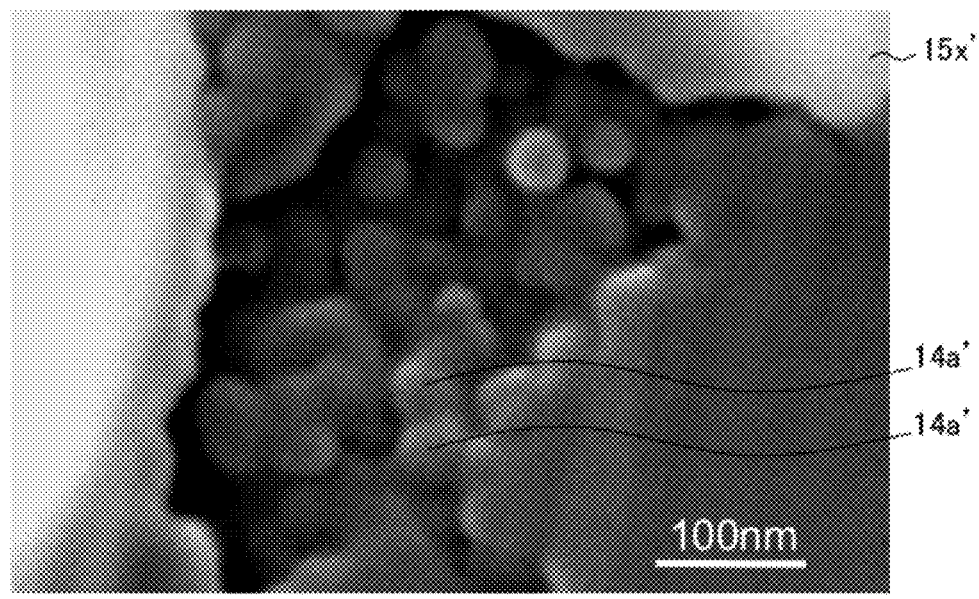
FIG. 8A is an enlarged photograph of an R4 section shown in FIG. 7B.
FIG. 8B is a photograph of a part of a cross section of a laminated plate of Sample 2 cut in a thickness direction thereof, which is taken using a field emission scanning electron microscope.
Figure 8:
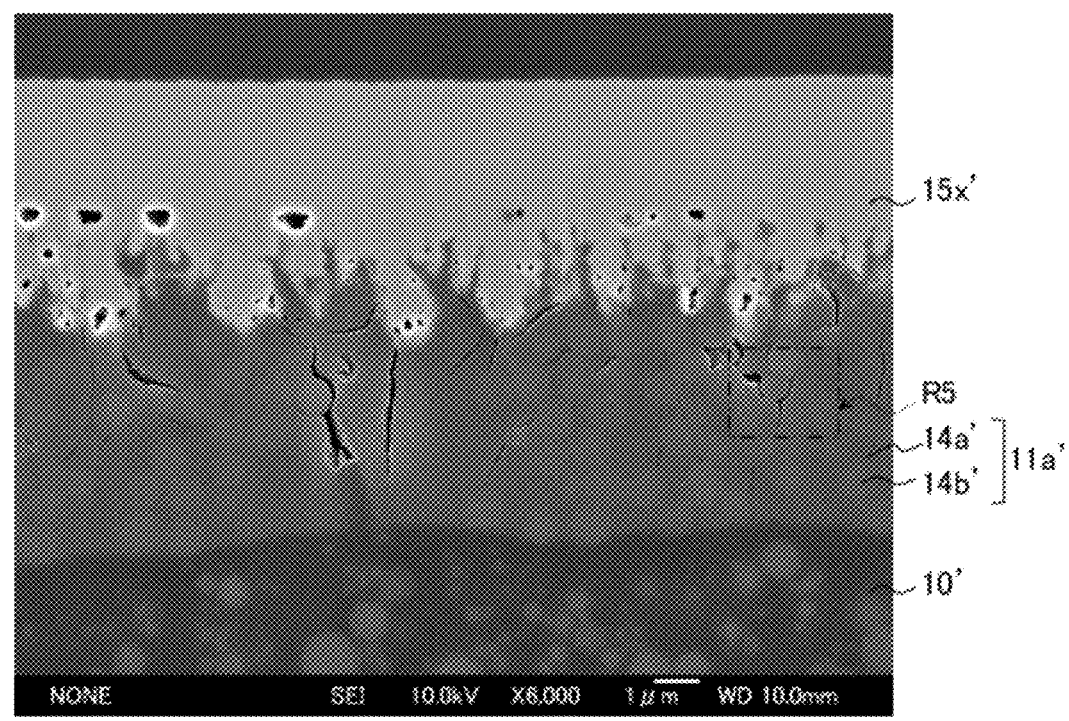
Figure 9:
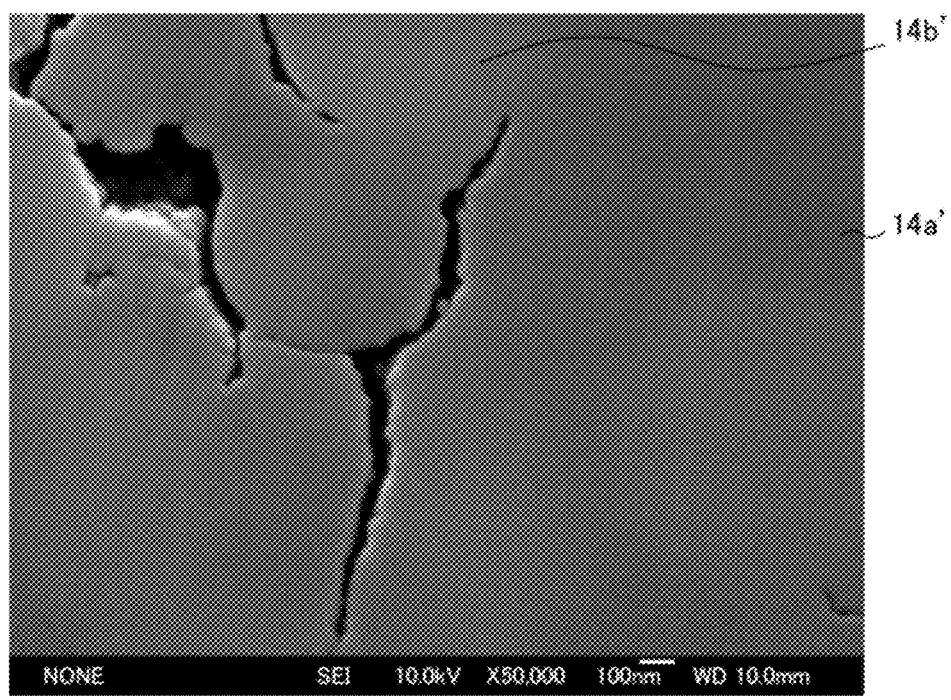
FIG. 9A is an enlarged photograph of an R5 section shown in FIG. 8B.
FIG. 9B is a photograph of a part of a cross section of a laminated plate of Sample 3 cut in a thickness direction thereof, which is taken using a field emission scanning electron microscope.
Figure 9:
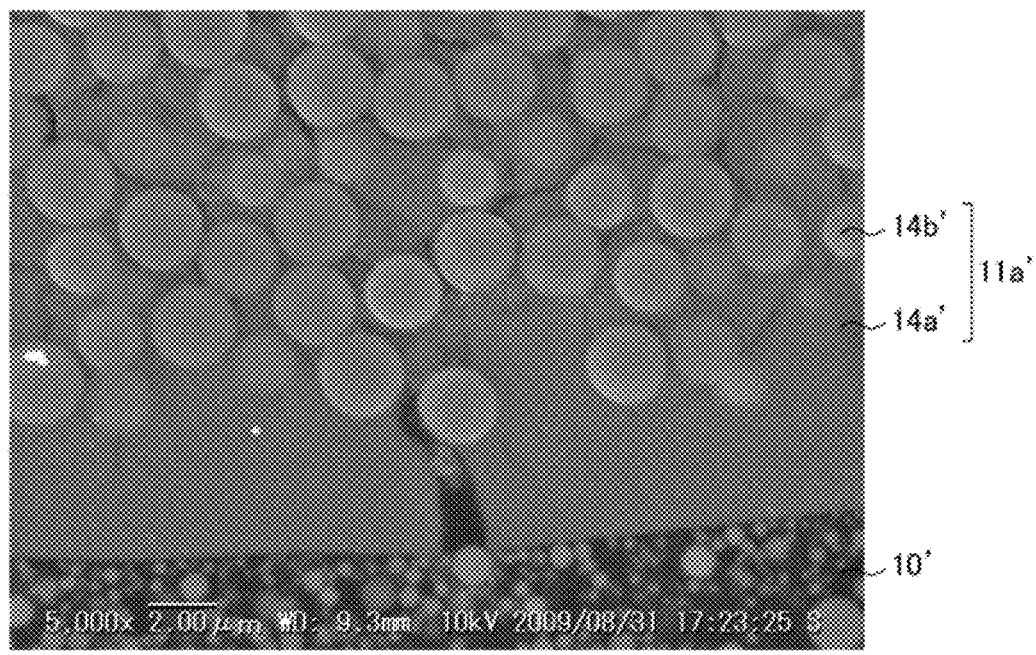

As shown in FIGS. 7A and 7B, a first inorganic insulating layer 11a' of Sample 1 included first inorganic insulating particles 14a'. As shown in FIG. 8B, it was found by observation that the first inorganic insulating particles 14a' were connected to each other.

As shown in FIGS. 8B through 9B, the first inorganic insulating layer 11a' of each of Samples 2 and 3 included second inorganic insulating particles 14b'. As compared with the first inorganic insulating layer of Sample 1, extension of cracks inside the first inorganic insulating layer 11a' along the thickness direction thereof was reduced.

Figure 10:
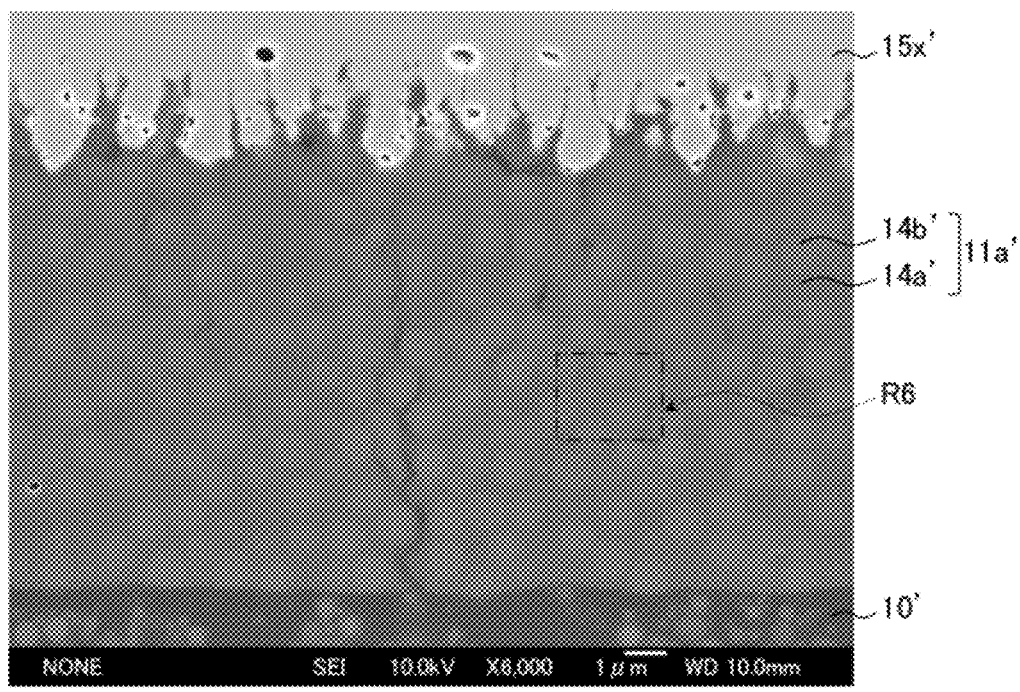
FIG. 10A is a photograph of a part of a cross section of a laminated plate of Sample 4 cut in a thickness direction thereof, which is taken using a field emission scanning electron microscope.
FIG. 10B is an enlarged photograph of an R6 section shown in FIG. 10A.
Figure 10:
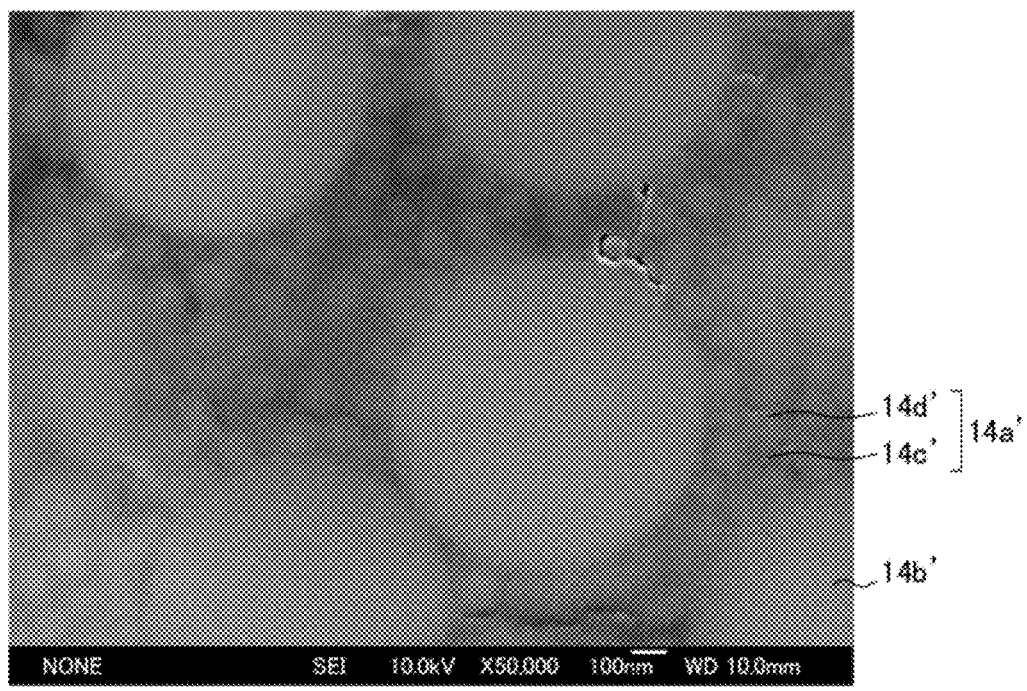

As shown in FIGS. 10A and 10B, the first inorganic insulating layer 11a' of Sample 4 included, as the first inorganic insulating particles 14a', third and fourth inorganic insulating particles 14c' and 14d'. As compared with the first inorganic insulating layer of each of Samples 2 and 3, extension of cracks between the second inorganic insulating particles 14b' was reduced.

Figure 11:
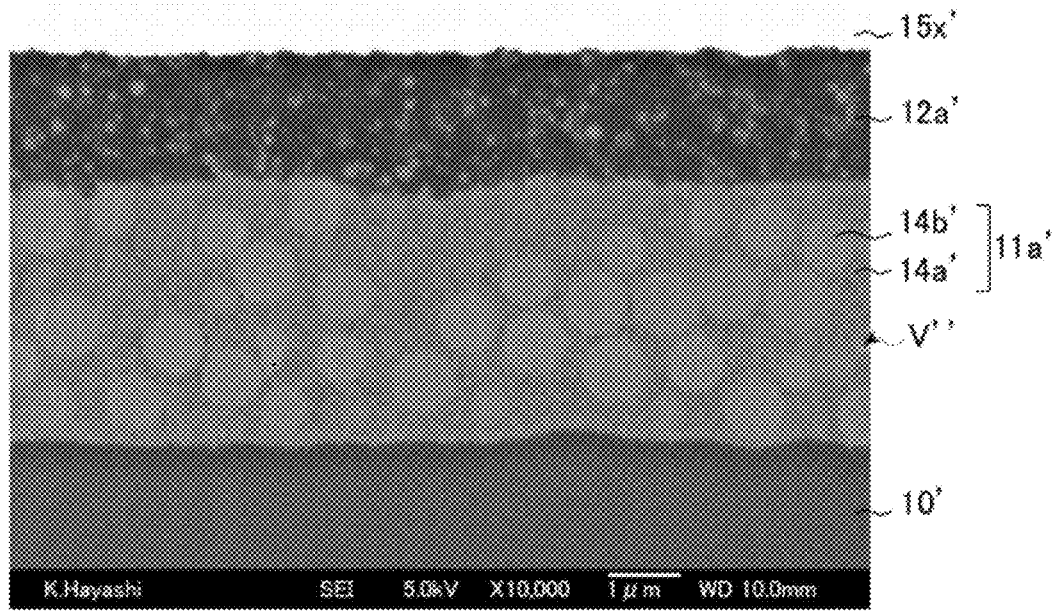
FIG. 11A is a photograph of a part of a cross section of a laminated plate of Sample 5 cut in a thickness direction thereof, which is taken using a field emission scanning electron microscope.
FIG. 11B is a photograph of a part of a cross section of an inorganic insulating layer of a laminated plate of Sample 6 cut in a thickness direction thereof, which is taken using a field emission scanning electron microscope.
Figure 11:
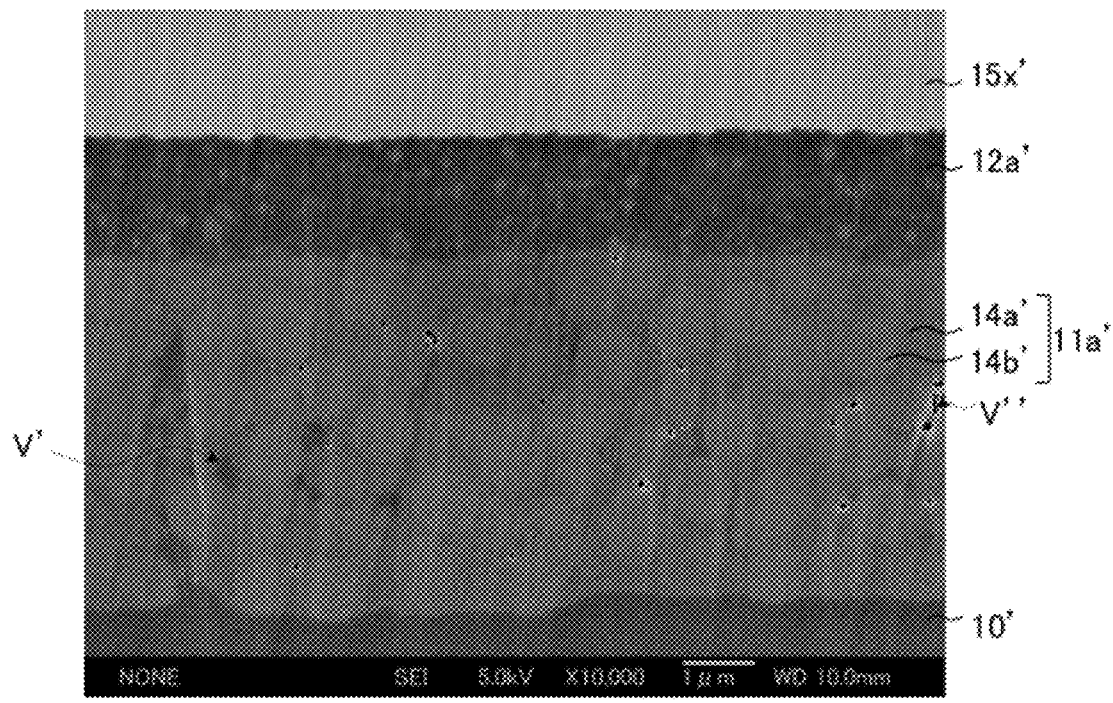
Figure 12:
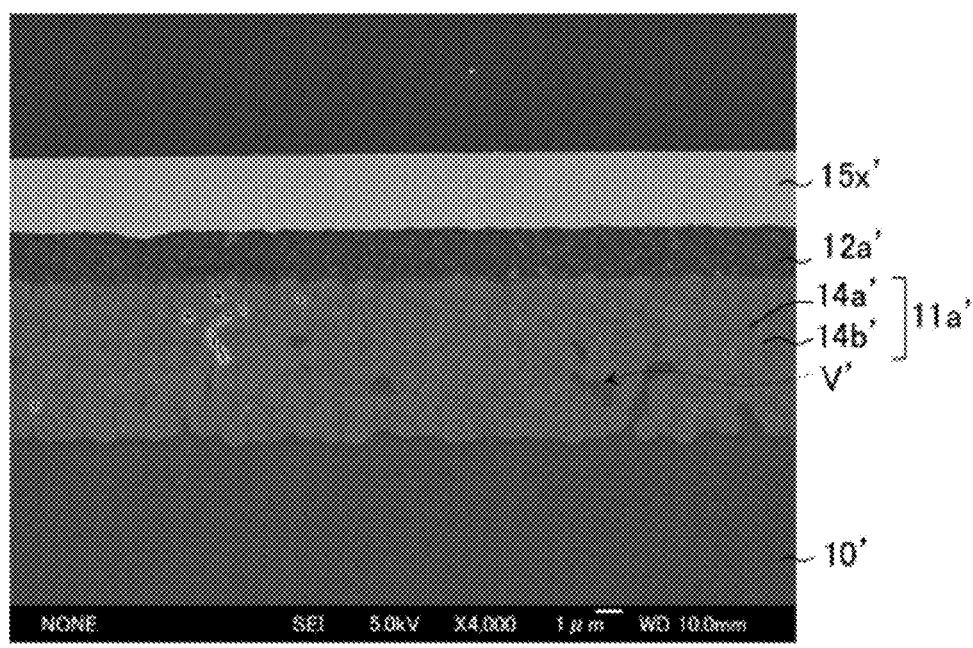
FIG. 12A is a photograph of a part of a cross section of an inorganic insulating layer of a laminated plate of Sample 7 cut in a thickness direction thereof, which is taken using a field emission scanning electron microscope.
FIG. 12B is a photograph of a part of a cross section of an inorganic insulating layer of a laminated plate of Sample 8 cut in a thickness direction thereof, which is taken using a field emission scanning electron microscope.
Figure 12:
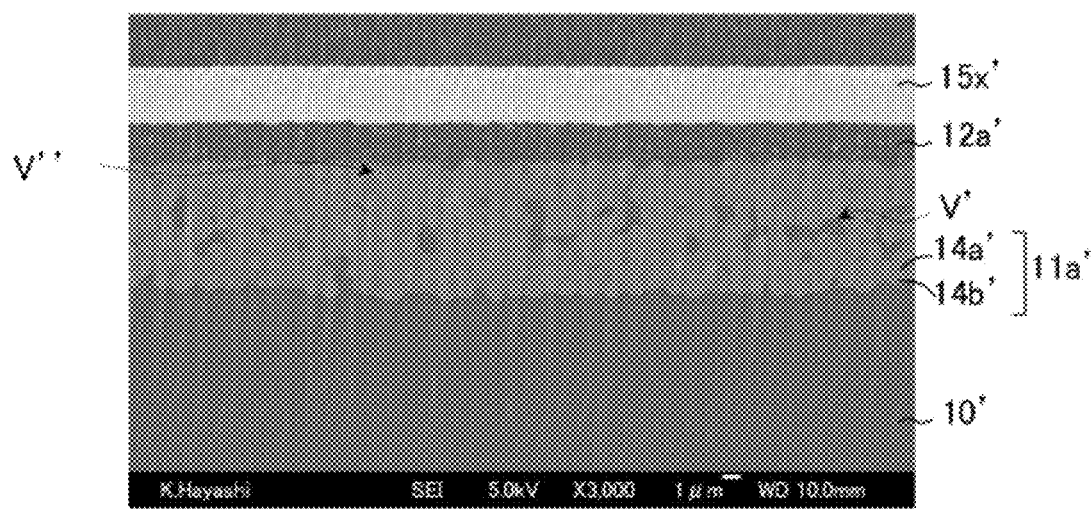
Figure 13:
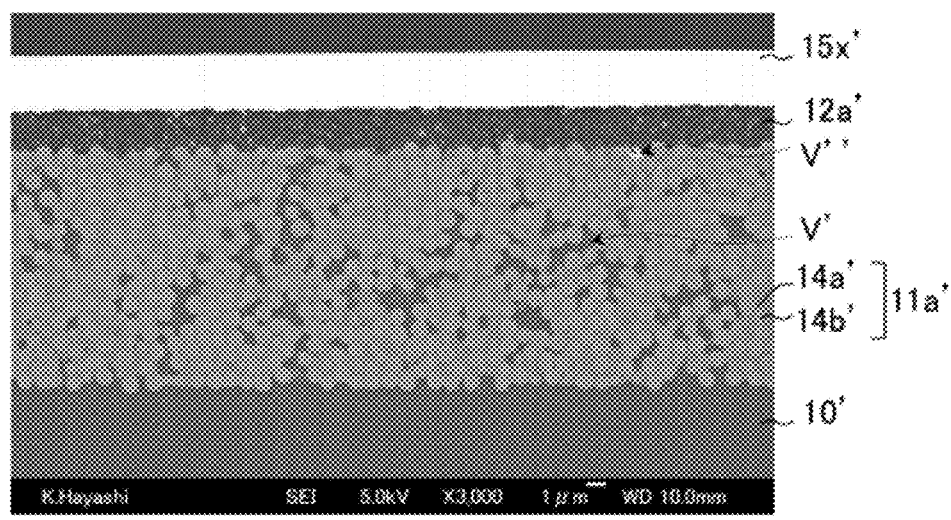
FIG. 13A is a photograph of a part of a cross section of an inorganic insulating layer of a laminated plate of Sample 9 cut in a thickness direction thereof, which is taken using a field emission scanning electron microscope.
FIG. 13B is a photograph of a part of a cross section of an inorganic insulating layer of a laminated plate of Sample 10 cut in a thickness direction thereof, which is taken using a field emission scanning electron microscope.
Figure 13:
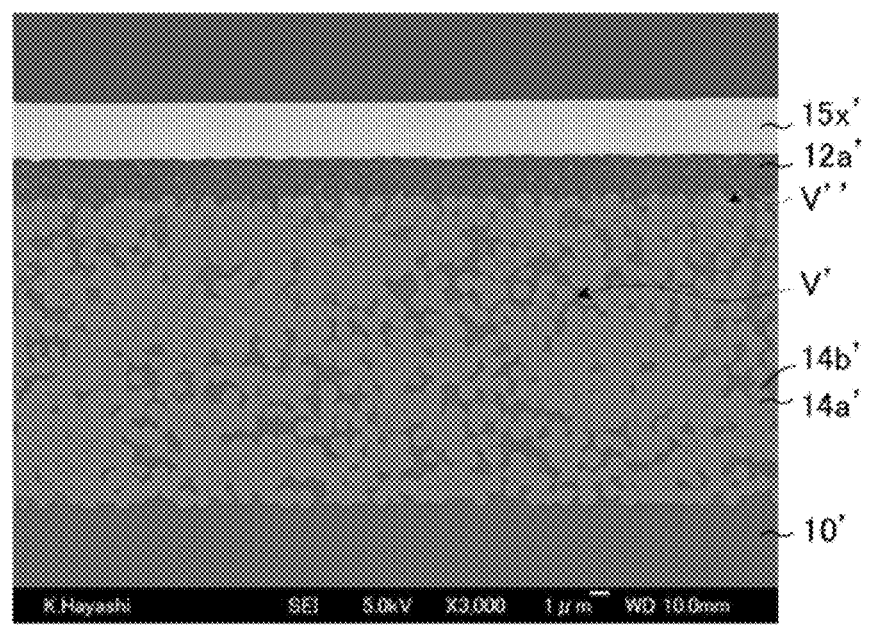

As shown in FIG. 11A, in the first inorganic insulating layer 11a' of Sample 5, there were formed air bubbles V''', each of which bore no part of a resin base 10'.

As shown in FIGS. 11B to 13B, in the first inorganic insulating layer 11a' of each of Samples 6 to 10, there were formed voids V', each of which was surrounded by the first and second inorganic insulating particles 14a' and 14b' as seen in the section taken along the thickness direction thereof, and bore part of a resin base 10'. Moreover, it was found that, the greater the solid content proportion of the second inorganic insulating particles 14b became, the larger the number of the voids V' bearing part of the resin base 10' became, with the consequent increase of complexity in form.

<Elastic Modulus and Hardness of First Inorganic Insulating Layer>

As seen from Sample 38 in Table 1, the elastic modulus of silica glass is 71.9 GPa. On the other hand, as seen from Samples 1, 5 to 8, and 10 to 37 in Table 1, the elastic modulus of the first inorganic insulating layer was 10.8 GPa or more and 39.4 GPa or less.

In addition, as seen from Sample 38 in Table 1, the hardness of silica glass is 10.1 GPa. On the other hand, as seen from Samples 1, 5 to 8, and 10 to 37 in Table 1, the hardness of the first inorganic insulating layer was 0.6 GPa or more and 3.4 GPa or less.

<Raman Spectroscopic Analysis for Inorganic Insulating Particles>

(Evaluation Method)

With the first and second inorganic insulating particles prepared as measurement target samples, Raman scattering intensity was measured by observing Raman spectrum produced through laser irradiation (wavelength: 514.53 nm) to the samples using a laser Raman spectrometer LabRAM HR-800 manufactured by HORIBA, Ltd.

(Measurement Sample)

The product "PGM-ST" in a dried state (manufactured by Nissan Chemical Industries. Ltd.) was used for the first inorganic insulating particles. On the other hand, the product "QUARTRON SP-1B" in a dried state (manufactured by Fuso Chemical Co., Ltd.) was used for the second inorganic insulating particles.

(Raman Scattering Intensity of First and Second Inorganic Insulating Particles)

Figure 14:
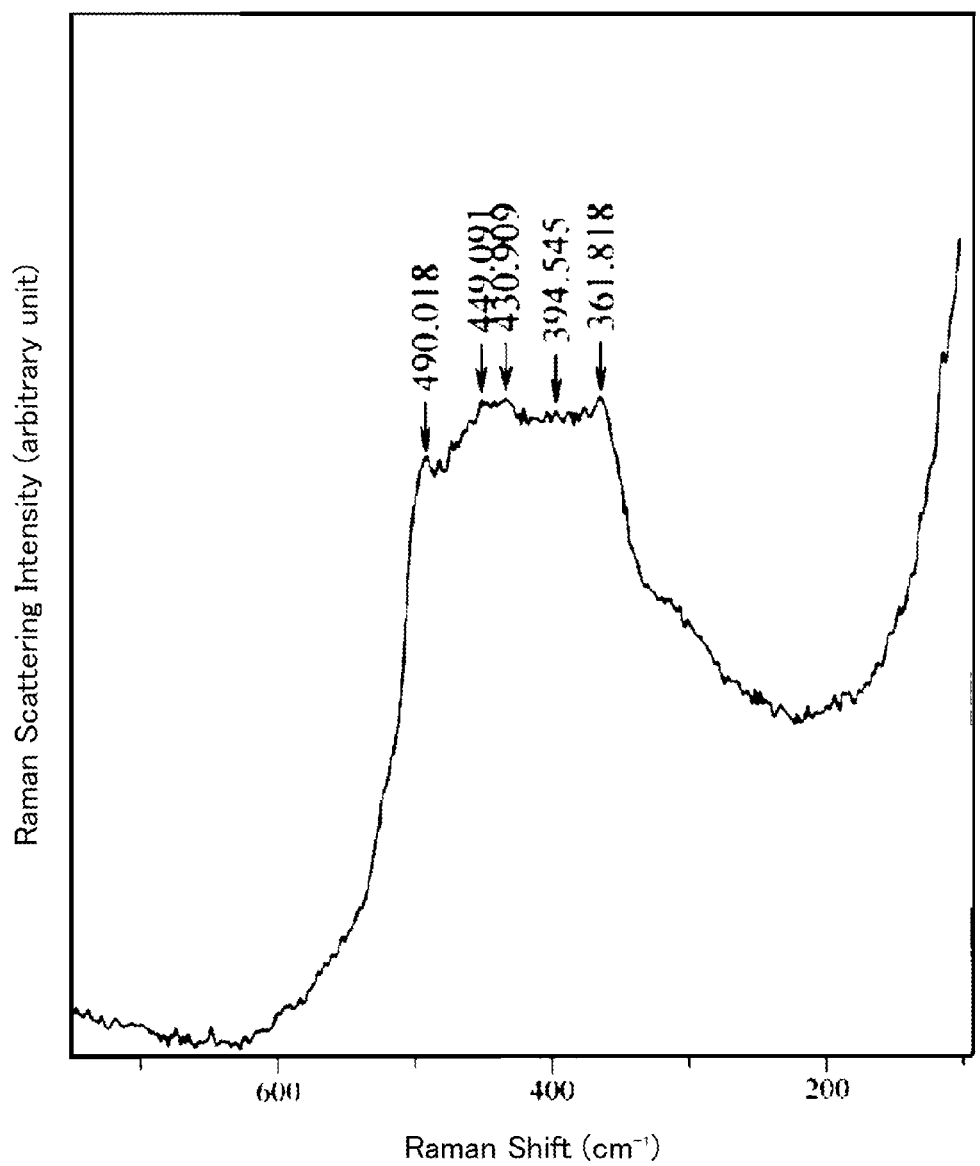
FIG. 14 is a result of measurement on first inorganic insulating particles analyzed by a laser Raman spectrometer.

As shown in FIG. 14, in the first inorganic insulating particles, within a Raman shift range of 600 cm$^{-1}$ to 620 cm$^{-1}$, there was no sign of a peak of Raman scattering intensity indicative of the three-membered ring structure.

In addition, within a Raman shift range of 480 cm$^{-1}$ or more and 500 cm$^{-1}$ or less, the first inorganic insulating particles exhibited a peak of Raman scattering intensity (Raman shift: 490.018 cm$^{-1}$). It is known that this Raman scattering intensity peak is indicative of a four-membered ring structure of silicon oxide. It is also known that other peaks of Raman scattering intensity that are lower than the above Raman scattering intensity peak in respect of Raman shift value are indicative of five or more-membered ring structure of silicon oxide.

Figure 15:
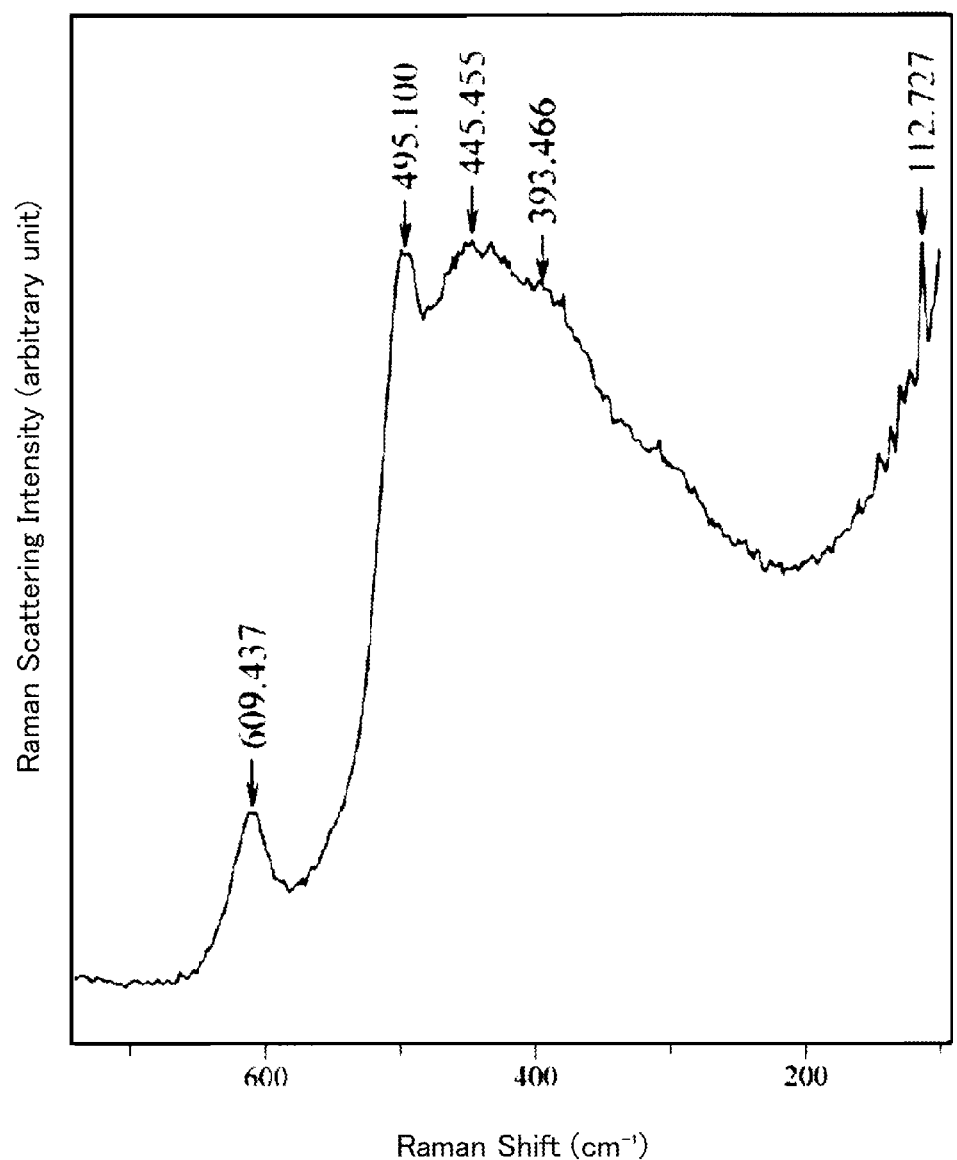
FIG. 15 is a result of measurement on second inorganic insulating particles analyzed by a laser Raman spectrometer.

On the other hand, as shown in FIG. 15, within a Raman shift range of 600 cm$^{-1}$ or more and 620 cm$^{-1}$ or less, the second inorganic insulating particles exhibited a peak of Raman scattering intensity (Raman shift: 609.437 cm$^{-1}$). The value of this Raman scattering intensity peak is greater than the value of Raman scattering intensity at Raman shift of 600 cm$^{-1}$.

In addition, within a Raman shift range of 480 cm$^{-1}$ or more and 500 cm$^{-1}$ or less, the second inorganic insulating particles exhibited a peak of Raman scattering intensity (Raman shift: 495.100 cm$^{-1}$). The value of this Raman scattering intensity peak is greater than the value of Raman scattering intensity of the first inorganic insulating particles within a Raman shift range of 480 cm$^{-1}$ or more and 500 cm$^{-1}$ or less.

REFERENCE SIGNS LIST

1: Mounting structure
2: Electronic component
3: Circuit board
4: Bump
5: Core substrate
6: Circuit layer
7: Base
8: Through hole conductor
9: Insulating body
10: Resin base
10x: Resin base precursor
11a: First inorganic insulating layer
11b: Second inorganic insulating layer 11x: Inorganic insulating sol
12a: First resin layer
12b: Second resin layer
12bx: Resin precursor sheet
13a: First filler
13b: Second filler
13c: Third filler
14a: First inorganic insulating particle
14b: Second inorganic insulating particle
14c: Third inorganic insulating particle
14d: Fourth inorganic insulating particle
15: Conductive layer
15x: Metal foil
16: Via conductor
17: Laminate sheet

The invention claimed is:

1. A structure, comprising:
an inorganic insulating layer that includes first inorganic particles including amorphous silicon oxide and second inorganic insulating particles including amorphous silicon oxide and has an elastic modulus which is 45 GPa or less,
the first inorganic insulating particles being connected to each other,
the second inorganic insulating particles being connected to each other via the first inorganic insulating particles and having a larger particle diameter than a particle diameter of the first inorganic insulating particles,
wherein an elastic modulus of the first inorganic insulating particles is smaller than an elastic modulus of the second inorganic insulating particles.

2. The structure according to claim 1,
wherein a peak value of Raman scattering intensity within a Raman shift range of 600 cm−1 or more and 620 cm−1 or less in the inorganic insulating layer is smaller than a peak value of Raman scattering intensity within a Raman shift range of 600 cm−1 or more and 620 cm−1 or less in the second inorganic insulating particles.

3. The structure according to claim 1,
wherein a proportion of three-membered ring structure to multi-membered ring structure of the first inorganic insulating particles is smaller than a proportion of three-membered ring structure to multi-membered ring structure of the second inorganic insulating particles.

4. The structure according to claim 1,
wherein the particle diameter of the first inorganic insulating particles is within a range of 3 nm or more and 110 nm or less.

5. The structure according to claim 4,
wherein the particle diameter of the second inorganic insulating particles is within a range of 0.5 μm or more and 5 μm or less.

6. The structure according to claim 1,
further comprising a first resin layer disposed on the inorganic insulating layer.

7. The structure according to claim 6,
further comprising a conductive layer disposed on a part of the first resin layer.

8. The structure according to claim 7,
further comprising a second resin layer disposed on a region of the first resin layer where the conductive layer is not disposed,
wherein one main surface of the conductive layer is in contact with the first resin layer;
a side surface and other main surface of the conductive layer are in contact with the second resin layer,
a thickness of the first resin layer is smaller than a thickness of the second resin layer, and
an elastic modulus of the first resin layer is smaller than an elastic modulus of the second resin layer.

9. The structure according to claim 8,
wherein the inorganic insulating layer is plural and laminated each other, and
adjacent inorganic insulating layers are connected to each other via the first and second resin layers.

10. The structure according to claim 1,
wherein an elastic modulus of the inorganic insulating layer is 10 GPa or more.

11. The structure according to claim 10,
wherein a hardness of the inorganic insulating layer is within a range of 0.5 GPa or more and 4 GPa or less.

12. A structure, comprising:
an inorganic insulating layer that includes first inorganic particles including amorphous silicon oxide and second inorganic insulating particles including amorphous silicon oxide and has an elastic modulus which is 45 GPa or less,
the first inorganic insulating particles being connected to each other,
the second inorganic insulating particles being connected to each other via the first inorganic insulating particles and having a larger particle diameter than a particle diameter of the first inorganic insulating particles,
wherein a proportion of three-membered ring structure to multi-membered ring structure of the first inorganic insulating particles is smaller than a proportion of three-membered ring structure to multi-membered ring structure of the second inorganic insulating particles.

* * * * *